(12) United States Patent
Yoshida

(10) Patent No.: US 12,091,774 B2
(45) Date of Patent: Sep. 17, 2024

(54) NITRIDE SEMICONDUCTOR SUBSTRATE, LAMINATED STRUCTURE, AND METHOD FOR MANUFACTURING NITRIDE SEMICONDUCTOR SUBSTRATE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 432 days.

(21) Appl. No.: 17/426,334

(22) PCT Filed: Jan. 23, 2020

(86) PCT No.: PCT/JP2020/002333
§ 371 (c)(1),
(2) Date: Oct. 22, 2021

(87) PCT Pub. No.: WO2020/158571
PCT Pub. Date: Aug. 6, 2020

(65) Prior Publication Data
US 2022/0106706 A1 Apr. 7, 2022

(30) Foreign Application Priority Data

Feb. 1, 2019 (JP) .................. 2019-016908

(51) Int. Cl.
C30B 29/40 (2006.01)
C30B 25/20 (2006.01)
(Continued)

(52) U.S. Cl.
CPC .......... C30B 29/403 (2013.01); C30B 25/20 (2013.01); C30B 33/00 (2013.01); H01L 29/045 (2013.01); H01L 29/2003 (2013.01); H01L 29/34 (2013.01)

(58) Field of Classification Search
CPC ..... C30B 29/403; C30B 29/406; C30B 25/20; C30B 33/00; H01L 29/045; H01L 29/2003; H01L 29/34
See application file for complete search history.

(56) References Cited

U.S. PATENT DOCUMENTS 6,468,347 B1 * 10/2002 Motoki ................. C30B 33/00
117/106
10,978,296 B2 * 4/2021 Yoshida ............ H01L 21/02005
(Continued)

FOREIGN PATENT DOCUMENTS

JP 2001-102307 A 4/2001
JP 2003-165799 A 6/2003
(Continued)

OTHER PUBLICATIONS

International Preliminary Report on Patentability, dated Aug. 12, 2021, issued in corresponding International Patent Application PCT/JP2020/002333 (10 pages).
(Continued)

Primary Examiner — Michael Zhang
(74) Attorney, Agent, or Firm — Foley & Lardner LLP

(57) ABSTRACT

A nitride semiconductor substrate that is constituted by a single crystal of a group III nitride semiconductor and includes a main surface for which the closest low index crystal plane is a (0001) plane includes an inclined interface growth region that has grown with inclined interfaces other than the (0001) plane serving as growth surfaces. A ratio of an area occupied by the inclined interface growth region in the main surface is 80% or more. When a dislocation density is determined based on a dark spot density by observing the main surface in a field of view that is 250 μm square using a multiphoton excitation microscope, the main surface does not include a region that has a dislocation density higher than $3 \times 10^6$ cm$^{-2}$, and the main surface includes dislocation-
(Continued)

free regions that are 50 μm square and do not overlap each other, at a density of 100 regions/cm² or more.

7 Claims, 15 Drawing Sheets

(51) Int. Cl.
    *C30B 33/00*     (2006.01)
    *H01L 29/04*     (2006.01)
    *H01L 29/20*     (2006.01)
    *H01L 29/34*     (2006.01)

(56) References Cited

U.S. PATENT DOCUMENTS

| | | | |
|---|---|---|---|
| 2002/0028564 A1* | 3/2002 | Motoki | H01L 21/02546 438/460 |
| 2003/0080345 A1 | 5/2003 | Motoki et al. | |
| 2006/0272572 A1* | 12/2006 | Uematsu | C30B 29/403 257/E21.127 |
| 2012/0091463 A1 | 4/2012 | Yokogawa et al. | |
| 2012/0126371 A1* | 5/2012 | Sato | H01L 21/02664 257/E29.107 |
| 2013/0072005 A1 | 3/2013 | Fujikura | |
| 2019/0198312 A1 | 6/2019 | Yoshida et al. | |
| 2021/0317597 A1* | 10/2021 | Yoshida | C30B 25/18 |
| 2022/0005691 A1* | 1/2022 | Yoshida | H01L 29/003 |

FOREIGN PATENT DOCUMENTS

| | | |
|---|---|---|
| JP | 2013-060349 A | 4/2013 |
| JP | 6595731 B1 | 10/2019 |
| WO | WO-2013/058352 A1 | 4/2013 |

OTHER PUBLICATIONS

International Searching Authority, "International Search Report," issued in connection with International Patent Application No. PCT/JP2020/002333, dated Mar. 31, 2020.

International Searching Authority, "Written Opinion," issued in connection with International Patent Application No. PCT/JP2020/002333, dated Mar. 31, 2020.

* cited by examiner

S100 Base substrate preparation step
S220 Inclined interface expansion step
S240 Inclined interface maintenance step

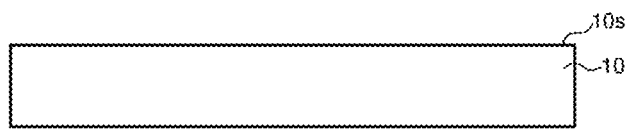
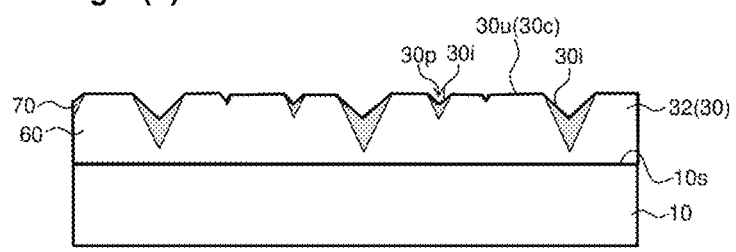
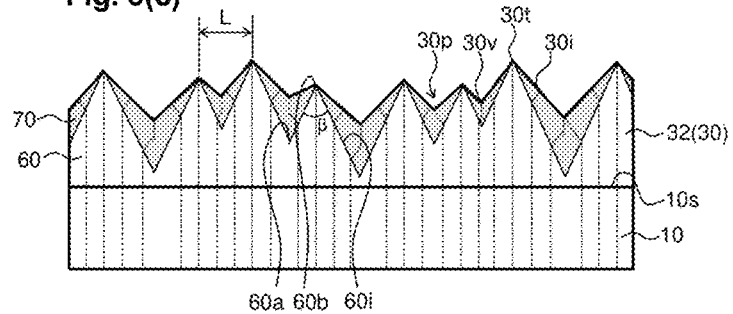

Fig. 13(a) Example
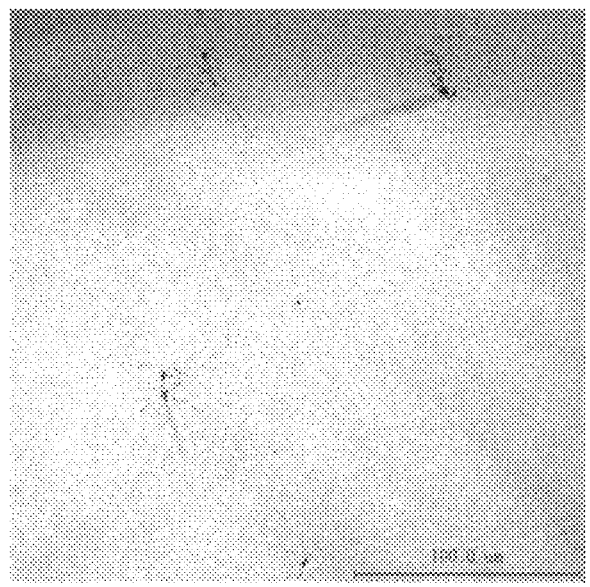
Fig. 13(b) Reference example
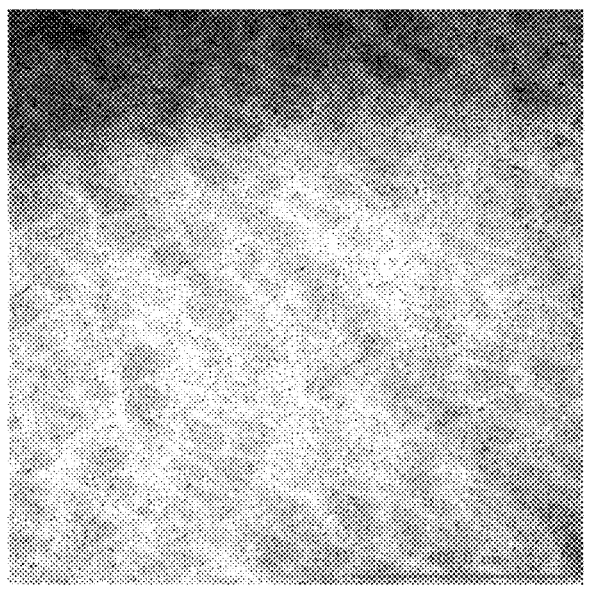

Fig. 14(a) Example
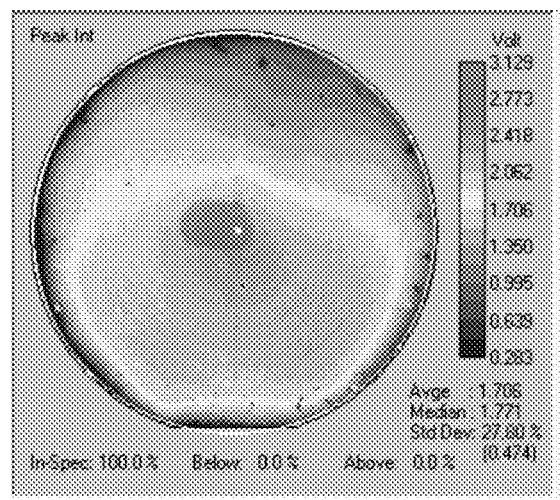
Fig. 14(b) Reference example
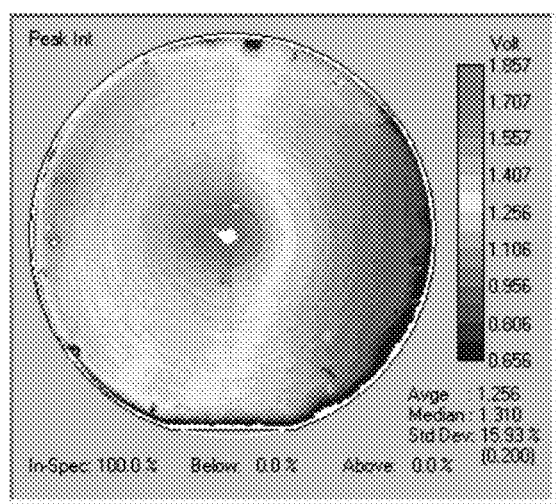

NITRIDE SEMICONDUCTOR SUBSTRATE, LAMINATED STRUCTURE, AND METHOD FOR MANUFACTURING NITRIDE SEMICONDUCTOR SUBSTRATE

CROSS-REFERENCE TO RELATED APPLICATIONS

The present application claims priority under 37 U.S.C. § 371 to International Patent Application No. PCT/JP2020/002333, filed Jan. 23, 2020, which claims priority to and the benefit of Japanese Patent Application No. 2019-016908, filed on Feb. 1, 2019. The contents of these applications are hereby incorporated by reference in their entireties.

TECHNICAL FIELD

The present disclosure relates to a nitride semiconductor substrate, a laminated structure, and a method for manufacturing a nitride semiconductor substrate.

BACKGROUND ART

In a conventionally-known technique, a substrate that is constituted by a single crystal of a group III nitride semiconductor is used as a base substrate (seed substrate), and a crystal layer that is constituted by a single crystal of a group III nitride semiconductor is further grown on a main surface of the base substrate for which the closest low index crystal plane is a (0001) plane. According to this technique, at least one nitride semiconductor substrate can be obtained by slicing the crystal layer grown to a predetermined thickness (for example, Patent Document 1).

CITATION LIST

Patent Documents

Patent Document 1: Japanese Patent Application Laid-Open Publication No. 2013-60349

SUMMARY OF INVENTION

Technical Problem

An object of the present disclosure is to provide a technology that makes it possible to easily and stably obtain a nitride semiconductor substrate that has good crystal quality.

Solution to Problem

According to an aspect of the present disclosure,
provided is a nitride semiconductor substrate that is constituted by a single crystal of a group III nitride semiconductor and includes a main surface for which the closest low index crystal plane is a (0001) plane, the nitride semiconductor substrate including:
an inclined interface growth region that has grown with inclined interfaces other than the (0001) plane serving as growth surfaces,
wherein a ratio of an area occupied by the inclined interface growth region in the main surface is 80% or more,
when a dislocation density is determined based on a dark spot density by observing the main surface in a field of view that is 250 μm square using a multiphoton excitation microscope, the main surface does not include a region that has a dislocation density higher than $3 \times 10^6$ $cm^{-2}$, and
the main surface includes dislocation-free regions that are 50 μm square and do not overlap each other, at a density of 100 regions/$cm^2$ or more.

According to another aspect of the present disclosure, provided is a laminated structure including:
a base substrate that is constituted by a single crystal of a group III nitride semiconductor, has a mirror-finished main surface, and in which a low index crystal plane closest to the main surface is a (0001) plane;
a low oxygen concentration region that is provided directly on the main surface of the base substrate and is constituted by a single crystal of a group III nitride semiconductor; and
a high oxygen concentration region that is provided on the low oxygen concentration region and is constituted by a single crystal of a group III nitride semiconductor,
wherein an oxygen concentration in the high oxygen concentration region is higher than an oxygen concentration in the low oxygen concentration region, and
when any cross section that is perpendicular to the main surface is observed,
an upper surface of the low oxygen concentration region includes a plurality of valleys and a plurality of mountains, and
an average distance between a pair of mountains spaced apart from each other in a direction extending along the main surface is more than 100 μm, the pair of mountains being closest to each other among the plurality of mountains with one of the plurality of valleys sandwiched between them.

According to another aspect of the present disclosure, provided is a method for manufacturing a nitride semiconductor substrate using a vapor phase growth method, comprising:
a step of preparing a base substrate that is constituted by a single crystal of a group III nitride semiconductor, has a mirror-finished main surface, and in which a low index crystal plane closest to the main surface is a (0001) plane;
a step of growing a three-dimensional growth layer by epitaxially growing a single crystal of a group III nitride semiconductor that has a top surface at which a (0001) plane is exposed, directly on the main surface of the base substrate, generating a plurality of recessed portions formed by inclined interfaces other than the (0001) plane in the top surface, and gradually expanding the inclined interfaces toward an upper side of the main surface of the base substrate to make the (0001) plane disappear from the top surface at least once; and
a step of forming a nitride semiconductor substrate by slicing the three-dimensional growth layer,
wherein in the step of forming the three-dimensional growth layer,
a plurality of valleys and a plurality of peaks are formed in a surface of the three-dimensional growth layer by generating the plurality of recessed portions in the top surface of the single crystal and making the (0001) plane disappear, and
when any cross section that is perpendicular to the main surface is observed, an average distance between a pair of peaks spaced apart from each other in a direction extending along the main surface is more than 100 μm, the pair of peaks being closest to each other among the plurality of peaks with one of the plurality of valleys sandwiched between them.

Advantageous Effects of Invention

According to the present disclosure, it is possible to easily and stably obtain a nitride semiconductor substrate that has good crystal quality.

BRIEF DESCRIPTION OF DRAWINGS

FIGS. 3(a) to 3(c) are schematic cross-sectional views illustrating a part of the method for manufacturing a nitride semiconductor substrate according to the embodiment of the present disclosure.

FIG. 13(a) is a diagram showing a cathodoluminescence image of a surface of a semiconductor layer of a laminate of an example in Experiment 2, which was observed using a scanning electron microscope, and FIG. 13(b) is a diagram showing a cathodoluminescence image of a surface of a semiconductor layer of a reference laminate of a reference example in Experiment 2, which was observed using the scanning electron microscope.

FIG. 14(a) is a diagram showing a result of photoluminescence mapping measurement performed on the laminate of the example in Experiment 2, and FIG. 14(b) is a diagram showing a result of photoluminescence mapping measurement performed on the reference laminate of the reference example in Experiment 2.

DESCRIPTION OF EMBODIMENTS

<Embodiment of the Present Disclosure>

Hereinafter, an embodiment of the present disclosure will be described with reference to the drawings.
(1) Method for Manufacturing a Nitride Semiconductor Substrate A method for manufacturing a nitride semiconductor substrate according to the present embodiment will be described with reference to FIGS. 1 to 6.

Figure 1:
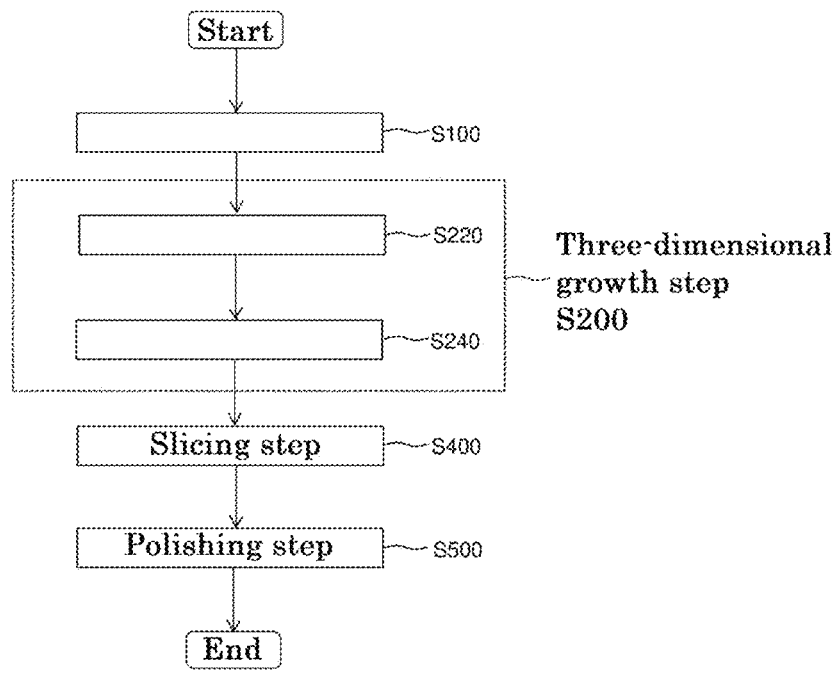
FIG. 1 is a flowchart illustrating a method for manufacturing a nitride semiconductor substrate according to an embodiment of the present disclosure.
Figure 4:
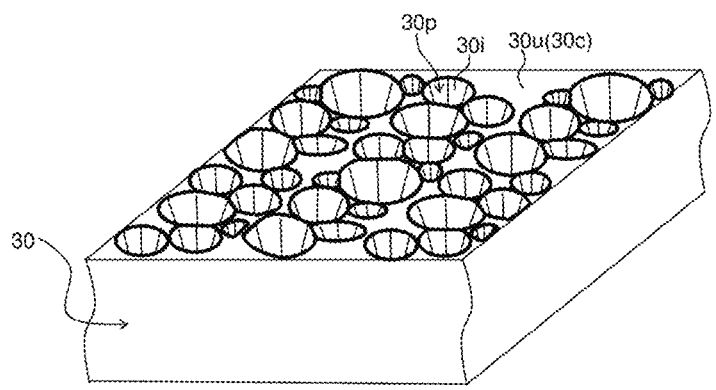
FIG. 4 is a schematic perspective view illustrating a part of the method for manufacturing a nitride semiconductor substrate according to the embodiment of the present disclosure.

FIG. 1 is a flowchart illustrating the method for manufacturing a nitride semiconductor substrate according to the present embodiment. FIGS. 2(a) to 2(g), FIGS. 3(a) to 3(c), and FIGS. 5(a) to 5(b) are schematic cross-sectional views illustrating a part of the method for manufacturing a nitride semiconductor substrate according to the present embodiment. FIG. 4 is a schematic perspective view illustrating a part of the method for manufacturing a nitride semiconductor substrate according to the present embodiment. FIG. 4 corresponds to a perspective view at a time point of FIG. 3(b), and illustrates a part of a three-dimensional growth layer 30 grown on a base substrate 10. Dotted lines indicate dislocations in FIGS. 3(c) to 5(b).

As illustrated in FIG. 1, the method for manufacturing a nitride semiconductor substrate according to the present embodiment includes, for example, a base substrate preparation step S100, a three-dimensional growth step S200, a slicing step S400, and a polishing step S500.
S100: Base Substrate Preparation Step First, in the base substrate preparation step S100, a base substrate 10 that is constituted by a single crystal of a group III nitride semiconductor is prepared. In the present embodiment, for example, a gallium nitride (GaN) free-standing substrate is prepared as the base substrate 10.

Hereinafter, in a crystal of a group III nitride semiconductor having a wurtzite structure, a <0001> axis (for example, [0001] axis) is referred to as a "c-axis", and a (0001) plane is referred to as a "c-plane". The (0001) plane may be referred to as a "+c plane (group III element polar plane)", and a (000-1) plane may be referred to as a "−c plane (nitrogen (N) polar plane)". Further, a <1-100> axis (for example, [1-100] axis) is referred to as an "m-axis", and a {1−100} plane is referred to as an "m-plane". The m-axis may be expressed as a <10−10> axis. Further, a <11−20> axis (for example, [11−20] axis) is referred to as an "a-axis", and a {11−20} plane is referred to as an "a-plane".

In the base substrate preparation step S100 of the present embodiment, for example, the base substrate 10 is prepared by a VAS (Void-Assisted Separation) method.

Specifically, the base substrate preparation step S100 includes, for example, a crystal growth substrate preparation step S110, a first crystal layer forming step S120, a metal layer forming step S130, a void forming step S140, a second crystal layer forming step S150, a peeling step S160, a slicing step S170, and a polishing step S180.

S110: Crystal Growth Substrate Preparation Step

Figure 2A:
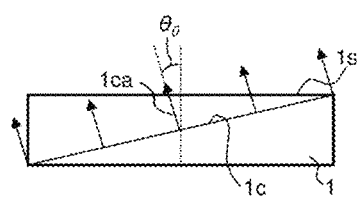
FIGS. 2(a) to 2(g) are schematic cross-sectional views illustrating a part of the method for manufacturing a nitride semiconductor substrate according to the embodiment of the present disclosure.

First, as illustrated in FIG. 2(a), a crystal growth substrate 1 (hereinafter may be abbreviated as a "substrate 1") is prepared. The substrate 1 is, for example, a sapphire substrate. Also, the substrate 1 may be, for example, a Si substrate or a gallium arsenide (GaAs) substrate. The substrate 1 has, for example, a main surface is which serves as a growth surface. A low index crystal plane that is closest to the main surface 1s is, for example, a c-plane 1c.

In the present embodiment, the c-plane 1c of the substrate 1 is inclined with respect to the main surface 1s. A c-axis 1ca of the substrate 1 is inclined at a predetermined off-angle $\theta_0$ with respect to the normal of the main surface is. The off-angle $\theta_0$ in the main surface is of the substrate 1 is uniform over the entire main surface is. The off-angle $\theta_0$ in the main surface is of the substrate 1 affects an off-angle $\theta_3$ at the center of a main surface 10s of the base substrate 10, which will be described later.

S120: First Crystal Layer Forming Step

Figure 2B:
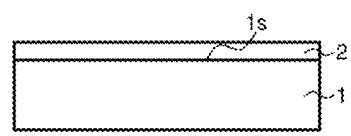

Next, as illustrated in FIG. 2(b), for example, a low-temperature growth GaN buffer layer and a Si-doped GaN layer are grown in this order as a first crystal layer (underground growth layer) 2 on the main surface is of the substrate 1, by supplying trimethylgallium (TMG) gas as a group III source gas, ammonia gas (NH$_3$) as a nitrogen source gas, and monosilane (SiH$_4$) gas as an n-type dopant gas, to the substrate 1 that is heated to a predetermined growth temperature, by a metalorganic vapor phase growth (MOVPE) method. At this time, the thickness of the low-temperature growth GaN buffer layer and the thickness of the Si-doped GaN layer are, for example, 20 nm and 0.5 μm, respectively.

S130: Metal Layer Forming Step

Figure 2C:
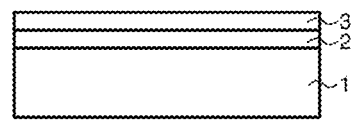

Next, as illustrated in FIG. 2(c), a metal layer 3 is deposited on the first crystal layer 2. The metal layer 3 is, for example, a titanium (Ti) layer. Further, the thickness of the metal layer 3 is, for example, 20 nm.

S140: Void Forming Step

Next, the above-described substrate 1 is put into an electric furnace, and the substrate 1 is placed on a susceptor having a predetermined heater. After the substrate 1 is placed on the susceptor, the substrate 1 is heated by the heater and heat treatment is performed thereto in an atmosphere containing hydrogen gas or hydride gas. Specifically, for example, the heat treatment is performed at a predetermined temperature for 20 minutes in a hydrogen (H$_2$) gas stream containing 20% NH$_3$ gas.

The heat treatment temperature is, for example, 850° C. or higher and 1,100° C. or lower. By performing such a heat treatment, the metal layer 3 is nitrided to form a metal nitride layer 5 having high-density fine holes on the surface. Further, by performing the above-described heat treatment, a part of the first crystal layer 2 is etched through the holes of the metal nitride layer 5 to form high-density voids in the first crystal layer 2.

Figure 2D:
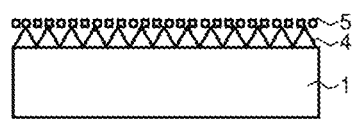
Figure 2E:
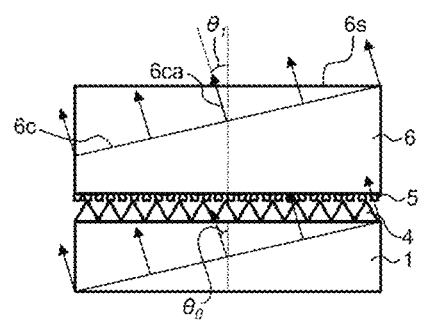

Thereby, as illustrated in FIG. 2(d), a void-containing first crystal layer 4 is formed.

S150: Second Crystal Layer Forming Step

Next, for example, a Si-doped GaN layer is epitaxially grown as a second crystal layer (main growth layer) 6 over the void-containing first crystal layer 4 and the metal nitride layer 5 by supplying gallium chloride (GaCl) gas, NH$_3$ gas, and dichlorosilane (SiH$_2$Cl$_2$) gas as an n-type dopant gas, to the substrate 1 that is heated to a predetermined growth temperature by a hydride vapor deposition (HVPE) method. A Ge-doped GaN layer may be epitaxially grown as the second crystal layer 6 by supplying tetrachlorogermane (GeCl$_4$) gas or the like instead of SiH$_2$Cl$_2$ gas, as an n-type dopant gas.

At this time, the second crystal layer 6 grows from the void-containing first crystal layer 4 over the void-containing first crystal layer 4 and the metal nitride layer 5 through the holes in the metal nitride layer 5. Some of the voids in the void-containing first crystal layer 4 are filled with the second crystal layer 6, but the other voids in the void-containing first crystal layer 4 remain. A flat gap is formed between the second crystal layer 6 and the metal nitride layer 5 due to the voids remaining in the void-containing first crystal layer 4. This gap causes peeling of the second crystal layer 6 in a peeling step S160 described later.

Further, at this time, the second crystal layer 6 grows by inheriting an orientation of the substrate 1. That is, an off-angle $\theta_1$ in the main surface of the second crystal layer 6 is uniform over the entire main surface, similarly to the off-angle $\theta_0$ in the main surface is of the substrate 1.

Further, at this time, the thickness of the second crystal layer 6 is, for example, 600 μm or more, and preferably 1 mm or more. An upper limit of the thickness of the second crystal layer 6 is not particularly limited, but is preferably 50 mm or less from the standpoint of improving productivity.

S160: Peeling Step

After the growth of the second crystal layer 6 is complete, the second crystal layer 6 naturally peels off from the substrate 1 by separating from the void-containing first crystal layer 4 and the metal nitride layer 5 in a process of cooling an HVPE apparatus used to grow the second crystal layer 6.

At this time, tensile stress is introduced into the second crystal layer 6 as a result of initial nuclei, which are generated in the growth process, attracting each other. Therefore, due to the tensile stress generated in the second crystal layer 6, an internal stress acts on the second crystal layer 6 such that a front surface side thereof becomes concave. Further, a dislocation density on the main surface (front surface) side of the second crystal layer 6 is low, while a dislocation density on a back surface side of the second crystal layer 6 is high. Therefore, due to the difference in the dislocation density in a thickness direction of the second crystal layer 6 as well, an internal stress acts on the second crystal layer 6 such that the front surface side thereof becomes concave.

Figure 2F:
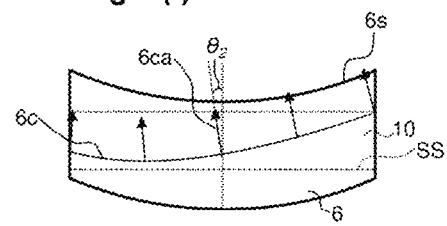

As a result, as illustrated in FIG. 2(f), after the second crystal layer 6 is peeled off from the substrate 1, the front surface side thereof is warped so as to be concave. Therefore, a c-plane 6c of the second crystal layer 6 is curved in a concave spherical shape with respect to a plane perpendicular to a normal direction of the center of the main surface 6s of the second crystal layer 6. An off-angle $\theta_2$ formed by a c-axis 6ca with respect to the normal of the center of the main surface 6s of the second crystal layer 6 has a predetermined distribution.

S170: Slicing Step

Next, as illustrated in FIG. 2(f), for example, the second crystal layer 6 is sliced using a wire saw along a cut surface SS substantially perpendicular to the normal direction of the center of the main surface 6s of the second crystal layer 6.

Figure 2G:
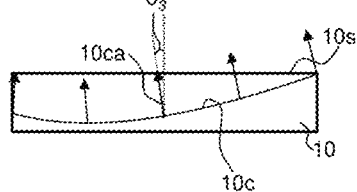

Thereby, as illustrated in FIG. 2(g), the base substrate 10 as an as-sliced substrate is formed. At this time, the thickness of the base substrate 10 is, for example, 450 μm. The off-angle $\theta_3$ of the base substrate 10 may change from the off-angle $\theta_2$ of the second crystal layer 6 due to dependence on the slice direction.

S180: Polishing Step

Next, both sides of the base substrate 10 are polished by a polishing device. Thereby, the main surface 10s of the base substrate 10 is mirror-finished.

By the above-described base substrate preparation step S100, the base substrate 10 constituted by a single crystal of GaN is obtained.

The base substrate 10 has a diameter of, for example, 2 inches or more. The base substrate 10 has a thickness of, for example, 300 μm or more and 1 mm or less.

The main surface 10s of the base substrate 10 has, for example, a main surface (base surface) 10s which serves as an epitaxial growth surface. In the present embodiment, a low index crystal plane that is closest to the main surface 10s is, for example, a c-plane (+c plane) 10c.

The c-plane 10c of the base substrate 10 is curved in a concave spherical shape with respect to the main surface 10s.

The term "spherical" as used herein means a curved surface that approximates to a spherical surface. Further, "approximates to a spherical surface" as used herein means approximating to a surface of a perfect circular sphere or an elliptical sphere within a predetermined range of error.

In the present embodiment, the c-plane 10c of the base substrate 10 has, for example, a curved surface that approximates to a spherical surface in each of a cross section taken along the m-axis and a cross section taken along the a-axis. A radius of curvature of the c-plane 10c of the base substrate 10 is, for example, 1 m or more and less than 10 m.

Since the c-plane 10c of the base substrate 10 is curved, the off-angle $\theta_3$ formed by a c-axis 10ca with respect to the normal of the center of the main surface 10s of the base substrate 10 has a predetermined distribution.

In the present embodiment, the size of the off-angle $\theta_3$ at the center of the main surface 10s of the base substrate 10 is, for example, more than 0° and 1° or less.

The size and a direction of the off-angle $\theta_3$ at the center of the main surface 10s of the base substrate 10 can be adjusted, for example, by adjusting a size and a direction of the off-angle $\theta_0$ of the crystal growth substrate 1 used in the above-described VAS method, and a slice angle and the slice direction in the slicing step S170.

Further, in the present embodiment, a root mean square roughness RMS of the main surface 10s of the base substrate 10 is, for example, less than 1 nm.

Further, in the present embodiment, since the base substrate 10 is manufactured by the above-described VAS method, the dislocation density in the main surface 10s of the base substrate 10 is low. Specifically, the dislocation density in the main surface 10s of the base substrate 10 is, for example, $3\times10^6$ cm$^{-2}$ or more and less than $1\times10^7$ cm$^{-2}$.

S200: Three-Dimensional Growth Step

After the base substrate 10 is prepared, the three-dimensional growth step S200 described below is performed using the base substrate 10 that has not been subjected to processing for forming a mask layer on the main surface 10s and processing for forming an uneven pattern on the main surface 10s as illustrated in FIG. 3(a). The "mask layer" as used herein means a mask layer that is constituted by silicon oxide or the like, has predetermined openings, and is used in a so-called ELO (Epitaxial Lateral Overgrowth) method, for example. Also, the "uneven pattern" as used herein means at least either of a trench and a ridge that are formed by performing patterning directly on the main surface of the base substrate and are used in a so-called pendeo-epitaxy method, for example. The uneven pattern referred to here has a difference in the height of 100 nm or more, for example. The base substrate 10 of the present embodiment is used in the three-dimensional growth step S200 in a state of not having the structures described above.

First, as illustrated in FIGS. 3(b), 3(c), 4, and 5(a), a single crystal of a group III nitride semiconductor that has a top surface 30u at which a c-plane 30c is exposed is epitaxially grown directly on the main surface 10s of the base substrate 10.

At this time, a plurality of recessed portions 30p surrounded by inclined interfaces 30i other than the c-plane are generated in the top surface 30u of the single crystal, and the inclined interfaces 30i are gradually expanded and the c-plane 30c is gradually contracted toward an upper side of the main surface 10s of the base substrate 10. Thereby, the c-plane 30c disappears from the top surface 30u at least once. As a result, a three-dimensional growth layer 30 in which the inclined interfaces 30i are present in a wide region of the surface is formed.

Also, at this time, an inclined interface growth region 70 (gray part in the drawings) grown with the inclined interfaces 30i other than the c-plane serving as growth surfaces is formed in the three-dimensional growth layer 30. Also, in a cross section of the three-dimensional growth layer 30 taken along the main surface 10s of the base substrate 10, an area occupied by the inclined interface growth region 70 is 80% or more, for example, as described later.

As described above, in the three-dimensional growth step S200, the three-dimensional growth layer 30 is three-dimensionally grown so as to intentionally roughen the main surface 10s of the base substrate 10. Even though the three-dimensional growth layer 30 is grown in such a manner, the three-dimensional growth layer 30 is grown as a single crystal as described above. In this respect, the three-dimensional growth layer 30 differs from a so-called low temperature growth buffer layer that is formed as an amorphous layer or a polycrystal on a dissimilar substrate such as sapphire before a group III nitride semiconductor is epitaxially grown on the dissimilar substrate.

In the present embodiment, for example, a layer that is constituted by the same group III nitride semiconductor as the group III nitride semiconductor constituting the base substrate 10 is epitaxially grown as the three-dimensional growth layer 30. Specifically, for example, a GaN layer is epitaxially grown as the three-dimensional growth layer 30 by heating the base substrate 10 and supplying GaCl gas and NH$_3$ gas to the heated base substrate 10 by the HVPE method.

Here, in order to realize the above-described growth process, for example, the three-dimensional growth layer 30 is grown under a predetermined first growth condition in the three-dimensional growth step S200.

Figure 6A:
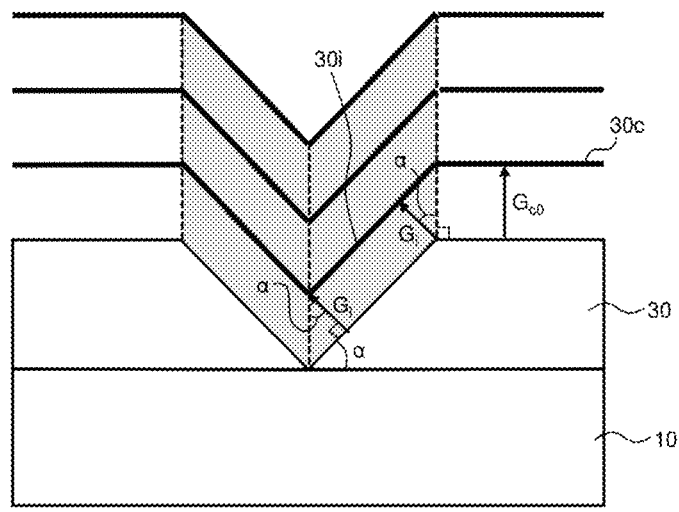
FIG. 6(a) is a schematic cross-sectional view illustrating a growth process under a reference growth condition under which an inclined interface and a c-plane are neither expanded nor contracted.

First, a reference growth condition under which the inclined interface 30i and the c-plane 30c are neither expanded nor contracted will be described with reference to FIG. 6(a). FIG. 6(a) is a schematic cross-sectional view illustrating a growth process under the reference growth condition under which the inclined interface and the c-plane are neither expanded nor contracted.

In FIG. 6(a), a thick solid line indicates the surface of the three-dimensional growth layer 30 for each unit time. The inclined interface 30i illustrated in FIG. 6(a) is the inclined interface that is most inclined with respect to the c-plane 30c. Further, in FIG. 6(a), $G_{c0}$ represents a growth rate of the c-plane 30c of the three-dimensional growth layer 30, $G_i$ represents a growth rate of the inclined interface 30i of the three-dimensional growth layer 30, and a represents an angle formed by the c-plane 30c and the inclined interface 30i in the three-dimensional growth layer 30. Also, in FIG. 6(a), the three-dimensional growth layer 30 grows while maintaining the angle α formed by the c-plane 30c and the inclined interface 30i. The off-angle of the c-plane 30c of the three-dimensional growth layer 30 is negligible as compared with the angle α formed by the c-plane 30c and the inclined interface 30i.

As illustrated in FIG. 6(a), when each of the inclined interface 30i and the c-plane 30c is neither expanded nor contracted, a locus of an intersection between the inclined interface 30i and the c-plane 30c is perpendicular to the c-plane 30c. Therefore, the reference growth condition under which each of the inclined interface 30i and the c-plane 30c is neither expanded nor contracted satisfies the following formula (a).

$$G_{c0} = G_i / \cos \alpha \qquad (a)$$

Figure 6B:
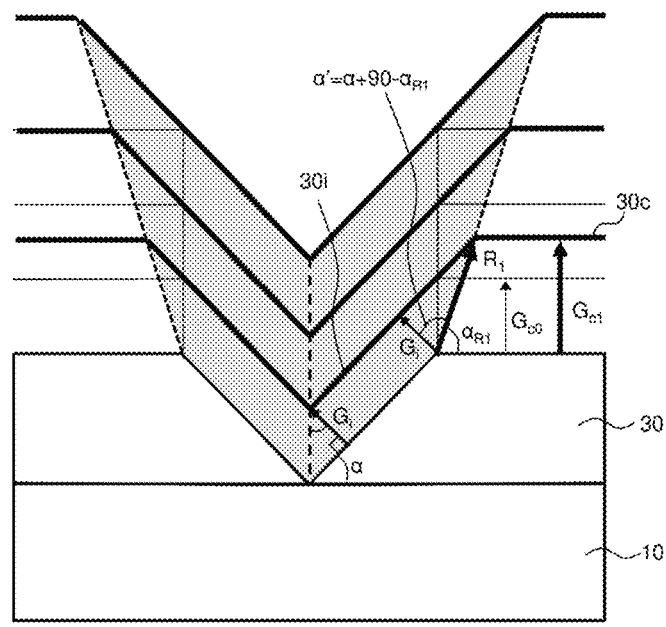
FIG. 6(b) is a schematic cross-sectional view illustrating a growth process under a first growth condition under which the inclined interface is expanded and the c-plane is contracted.

Next, the first growth condition under which the inclined interface 30i is expanded and the c-plane 30c is contracted will be described with reference to FIG. 6(b). FIG. 6(b) is a schematic cross-sectional view illustrating a growth process under the first growth condition under which the inclined interface is expanded and the c-plane is contracted.

In FIG. 6(b), as in FIG. 6(a), a thick solid line indicates the surface of the three-dimensional growth layer 30 for each unit time. Further, the inclined interface 30i illustrated in FIG. 6(b) is also the inclined interface most inclined with respect to the c-plane 30c. Also, in FIG. 6(b), $G_{c1}$ represents a growth rate of the c-plane 30c of the three-dimensional growth layer 30, and $R_1$ represents a progress rate of the locus of the intersection between the inclined interface 30i and the c-plane 30c of the three-dimensional growth layer 30. Further, $\alpha_{R1}$ represents a narrower angle of angles formed by the c-plane 30c and the locus of the intersection between the inclined interface 30i and the c-plane 30c. When α' represents an angle formed by $R_1$ direction and $G_i$ direction, $\alpha' = \alpha + 90 - \alpha_{R1}$ is satisfied. The off-angle of the c-plane 30c of the three-dimensional growth layer 30 is negligible as compared with the angle α formed by the c-plane 30c and the inclined interface 30i.

As illustrated in FIG. 6(b), the progress rate $R_1$ of the locus of the intersection between the inclined interface 30i and the c-plane 30c is represented by the following formula (b).

$$R_1 = G_i / \cos \alpha' \qquad (b)$$

Further, the growth rate $G_{c1}$ of the c-plane 30c of the three-dimensional growth layer 30 is represented by the following formula (c).

$$G_{c1} = R_1 \sin \alpha_{R1} \qquad (c)$$

By substituting the formula (b) into the formula (c), $G_{c1}$ is represented by the following formula (d) using $G_i$.

$$G_{c1} = G_i \sin \alpha_{R1} / \cos(\alpha + 90 - \alpha_{R1}) \qquad (d)$$

In order for the inclined interface 30i to expand and the c-plane 30c to contract, $\alpha_{R1} < 90°$ is preferable. Accordingly, the first growth condition under which the inclined interface 30i is expanded and the c-plane 30c is contracted preferably satisfies the following formula (1), due to satisfying formula (d) and $\alpha_{R1} < 90°$, $$G_{c1} > G_i / \cos \alpha \qquad (1)$$

wherein, as described above, $G_i$ represents the growth rate of the inclined interface 30i most inclined with respect to the c-plane 30c, and a represents the angle formed by the c-plane 30c and the inclined interface 30i most inclined with respect to the c-plane 30c.

Alternatively, it can be considered that $G_{c1}$ under the first growth condition is preferably larger than $G_{c0}$ under the reference growth condition. In this respect as well, the formula (1) can be derived by substituting the formula (a) into $G_{c1} > G_{c0}$.

Since the growth condition for expanding the inclined interface 30i most inclined with respect to the c-plane 30c is the strictest condition, when the first growth condition satisfies the formula (1), the other inclined interfaces 30i can also be expanded.

Specifically, for example, when the inclined interface 30i most inclined with respect to the c-plane 30c is a {10–11} plane, α=61.95°. Accordingly, the first growth condition preferably satisfies, for example, the following formula (1').

$$G_{c1} > 2.13 G_i \qquad (1')$$

Alternatively, for example, when inclined interfaces 30i are {11–2m} planes satisfying m≥3 as described later, the inclined interface 30i most inclined with respect to the c-plane 30c is a {11–23} plane, and therefore, α=47.3°. Accordingly, the first growth condition preferably satisfies, for example, the following formula (1").

$$G_{c1} > 1.47 G_i \qquad (1")$$

As the first growth condition of the present embodiment, for example, the growth temperature in the three-dimensional growth step S200 is set to be lower than the growth temperature of a case where a group III nitride semiconductor layer is grown with the c-plane typically serving as the growth surface. Specifically, the growth temperature in the three-dimensional growth step S200 is set to, for example, 980° C. or higher and 1,020° C. or lower, and preferably 1,000° C. or higher and 1,020° C. or lower.

Alternatively, as the first growth condition of the present embodiment, for example, a ratio (hereinafter also referred to as a "V/III ratio") of a partial pressure of a flow rate of $NH_3$ gas serving as a nitrogen source gas to a partial pressure of GaCl gas serving as a group III source gas in the three-dimensional growth step S200 may be made greater than the V/III ratio of a case where a group III nitride semiconductor layer is grown with the c-plane typically serving as the growth surface. Specifically, the V/III ratio in the three-dimensional growth step S200 is set to, for example, 2 or more and 20 or less, and preferably 2 or more and 15 or less.

In practice, at least either the growth temperature or the V/III ratio is adjusted as the first growth condition, within the above-described ranges so as to satisfy the formula (1).

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the three-dimensional growth step S200 of the present embodiment is classified into two steps based on the form of the three-dimensional growth layer 30 while growing, for example. Specifically, the three-dimensional growth step S200 of the present embodiment includes, for example, an inclined interface expansion step S220 and an inclined interface maintenance step S240. Through these steps, for example, an expanded inclined interface layer 32 and an inclined interface maintaining layer 34 are formed as the three-dimensional growth layer 30.

S220: Inclined Interface Expansion Step

First, as illustrated in FIGS. 3(b) and 4, the expanded inclined interface layer 32 of the three-dimensional growth layer 30 constituted by a single crystal of a group III nitride semiconductor is epitaxially grown directly on the main surface 10s of the base substrate 10 under the first growth condition described above.

In an initial stage of the growth of the expanded inclined interface layer 32, the expanded inclined interface layer 32 undergoes step-flow growth (two-dimensional growth) to a predetermined thickness in the normal direction (a direction extending along the c-axis) of the main surface 10s of the base substrate 10, with the c-plane 30c serving as the growth surface. Here, the portion of the expanded inclined interface layer 32 grown with the c-plane 30c serving as the growth surface will also be referred to as an "initial layer". Through this growth, the initial layer that has a mirror-finished surface is formed with the predetermined thickness. At this time, the initial layer is grown continuously in a direction extending along the main surface 10s of the base substrate 10, i.e., over the entire main surface 10s of the base substrate 10, for example. At this time, the thickness of the initial layer is, for example, 1 μm or more and 100 μm or less, and preferably 1 μm or more and 20 μm or less.

Thereafter, by gradually growing the expanded inclined interface layer 32 under the first growth condition, a plurality of recessed portions 30p formed by the inclined interfaces 30i other than the c-plane are generated in the top surface 30u of the expanded inclined interface layer 32 at which the c-plane 30c is exposed as illustrated in FIG. 3(b) and FIG. 4. The plurality of recessed portions 30p formed by the inclined interfaces 30i other than the c-plane are randomly formed in the top surface 30u. Thus, the expanded inclined interface layer 32 in which the c-plane 30c and the inclined interfaces 30i other than the c-plane coexist at the surface is formed.

The term "inclined interface 30i" as used herein means a growth interface inclined with respect to the c-plane 30c, and includes low index facets other than the c-plane, high index facets other than the c-plane, or inclined faces that cannot be represented by indices of crystal plane (Miller indices). Facets other than the c-plane are, for example, {11−2m}, {1−10n}, and the like. Wherein m and n are integers other than 0.

In the present embodiment, since the base substrate 10 described above is used and the first growth condition is adjusted so as to satisfy the formula (1), for example, a {11−2m} plane satisfying m≥3 can be generated as the inclined interface 30i. Thereby, an inclination angle of the {11−2m} plane with respect to the c-plane 30c can be made moderate. Specifically, the inclination angle can be 47.3° or less.

By further growing the expanded inclined interface layer 32 under the first growth condition, as illustrated in FIGS. 3(b) and 3(c), the inclined interfaces 30i other than the c-plane are gradually expanded and the c-plane 30c is gradually contracted in the expanded inclined interface layer 32 toward the upper side of the base substrate 10. At this time, the inclination angle formed by the inclined interfaces 30i with respect to the main surface 10s of the base substrate 10 gradually decreases toward the upper side of the base substrate 10. Thereby, most of the inclined interfaces 30i finally become {11−2m} planes satisfying m≥3 as described above.

When the expanded inclined interface layer 32 is further grown, the c-plane 30c of the expanded inclined interface layer 32 disappears from the top surface 30u at least once, and the outermost surface (uppermost surface) of the expanded inclined interface layer 32 is constituted only by the inclined interfaces 30i.

In this way, by forming the plurality of recessed portions 30p by the inclined interfaces 30i other than the c-plane in the top surface 30u of the expanded inclined interface layer 32 and making the c-plane 30c disappear, a plurality of valleys 30v and a plurality of peaks 30t are formed at the surface of the expanded inclined interface layer 32 as illustrated in FIG. 3(c). The plurality of valleys 30v are each an inflection point that is convex downward in the surface of the expanded inclined interface layer 32, and are formed above positions at which the inclined interfaces 30i other than the c-plane are generated. On the other hand, the plurality of peaks 30t are each an inflection point that is convex upward in the surface of the expanded inclined interface layer 32, and are formed at or above positions at which the c-plane 30c (finally) disappears, with a pair of inclined interfaces 30i that expand in opposite directions sandwiched between the positions. The valleys 30v and the peaks 30t are formed alternately in a direction extending along the main surface 10s of the base substrate 10.

As described above, in the present embodiment, in the initial stage of the growth of the expanded inclined interface layer 32, the expanded inclined interface layer 32 is grown so as to have the predetermined thickness on the main surface 10s of the base substrate 10 with the c-plane 30c serving as the growth surface without the inclined interfaces 30i being generated, and thereafter the inclined interfaces 30i other than the c-plane are generated in the surface of the expanded inclined interface layer 32. Therefore, the plurality of valleys 30v are formed at positions that are spaced upward from the main surface 10s of the base substrate 10.

Due to the growth process of the expanded inclined interface layer 32 described above, dislocations bend and propagate as follows. Specifically, as illustrated in FIG. 3(c), the plurality of dislocations extending along the c-axis in the base substrate 10 propagate from the base substrate 10 in a direction extending along the c-axis of the expanded inclined interface layer 32. In a region of the expanded inclined interface layer 32 that has grown with the c-plane 30c serving as the growth surface, the dislocations propagate from the base substrate 10 in the direction extending along the c-axis of the expanded inclined interface layer 32. However, when a growth interface at which the dislocations are exposed changes from the c-plane 30c to an inclined interface 30i in the expanded inclined interface layer 32, the dislocations bend and propagate in a direction that is substantially perpendicular to the inclined interface 30i at a position at which the inclined interface 30i is exposed. That is, the dislocations bend and propagate in a direction that is inclined with respect to the c-axis. Thereby, in the steps after the inclined interface expansion step S220, the dislocations are locally collected above substantially the center between each pair of peaks 30t. As a result, a dislocation density in the surface of the inclined interface maintaining layer 34, which will be described later, can be lowered.

At this time, in the present embodiment, when any cross section perpendicular to the main surface 10s of the base substrate 10 is observed, an average distance (also called "an average distance between closest peaks") L between a pair of peaks 30t spaced apart from each other in a direction extending along the main surface 10s of the base substrate 10 is, for example, more than 100 μm, the pair of peaks being closest to each other among the plurality of peaks 30t with one of the plurality of valleys 30v sandwiched between them. Note that the average distance L between closest peaks is a distance in a cross section that is observed when the c-plane 30c has disappeared from a crystal growth interface.

When the average distance L between closest peaks is 100 μm or less as in the case where fine hexagonal pyramid-shaped crystal nuclei are generated on the main surface 10s of the base substrate 10 from the initial stage of the inclined interface expansion step S220, a distance by which the dislocations bend and propagate in the steps after the inclined interface expansion step S220 becomes short. Therefore, the dislocations are not sufficiently collected above substantially the center between each pair of peaks 30t of the expanded inclined interface layer 32. As a result, the dislocation density in the surface of the inclined interface maintaining layer 34, which will be described later, may not be sufficiently lowered. In contrast, in the present embodiment, since the average distance L between closest peaks is more than 100 μm, it can be ensured that the dislocations bend and propagate at least by a distance longer than 50 μm in the steps after the inclined interface expansion step S220. Accordingly, the dislocations can be sufficiently collected above substantially the center between each pair of peaks 30t of the expanded inclined interface layer 32. As a result, the dislocation density in the surface of the inclined interface maintaining layer 34, which will be described later, can be sufficiently lowered.

On the other hand, in the present embodiment, the average distance L between closest peaks is less than 800 μm. If the average distance L between closest peaks is 800 μm or more, it takes time to make the c-plane 30c disappear from the entire surface in order to collect the dislocations in the entire surface. Therefore, productivity of the substrate 50 decreases. Also, if the average distance L between closest peaks is 800 μm or more, the height from the valley 30v to the peak 30t of the expanded inclined interface layer 32 may become excessively high. If there is a valley 30v in a crystal surface, the substrate 50 will include a penetrating pit when sliced, unless measures such as embedding growth are taken. Accordingly, the yield of the substrate 50 may decrease. However, in the present embodiment, the time it takes to make the c-plane 30c disappear from the entire surface can be shortened by making the average distance L between closest peaks less than 800 μm. As a result, productivity of the substrate 50 can be improved. Also, the height from the valley 30v to the peak 30t of the expanded inclined interface layer 32 can be reduced by making the average distance L between closest peaks less than 800 μm. Therefore, formation of valleys 30v that would cause penetrating pits when the substrate 50 is sliced can be suppressed. As a result, the yield of the substrate 50 can be improved.

Further, at this time, a c-plane growth region (first c-plane growth region, base-side c-plane growth region) 60 that has grown with the c-plane 30c serving as the growth surface and an inclined interface growth region 70 that has grown with the inclined interfaces 30i other than the c-plane serving as growth surfaces are formed in the expanded inclined interface layer 32, based on a difference in growth surfaces during the growth process.

Further, at this time, in the c-plane growth region 60, valleys 60a are formed at positions where the inclined interfaces 30i are generated, and mountains 60b are formed at positions where the c-plane 30c disappeared. Further, in the c-plane growth region 60, a pair of inclined portions 60i are formed on opposite sides of each mountain 60b as loci of intersections between the c-plane 30c and inclined interfaces 30i.

Further, at this time, an angle β formed by the pair of inclined portions 60i is, for example, 70° or less in a cross section taken along a plane that passes through centers of two adjacent valleys 60a, due to the first growth condition satisfying the formula (1).

Details of these regions will be described later.

S240: Inclined Interface Maintenance Step

After the c-plane 30c has disappeared from the surface of the expanded inclined interface layer 32, the first growth condition described above is maintained in the inclined interface maintenance step S240, similarly to the inclined interface expansion step S220.

Figure 5A:
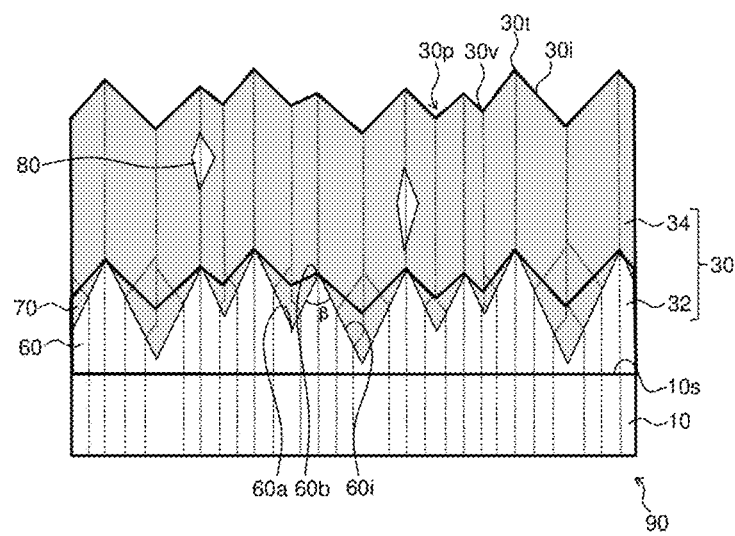
FIGS. 5(a) to 5(b) are schematic cross-sectional views illustrating a part of the method for manufacturing a nitride semiconductor substrate according to the embodiment of the present disclosure.
Figure 5B:
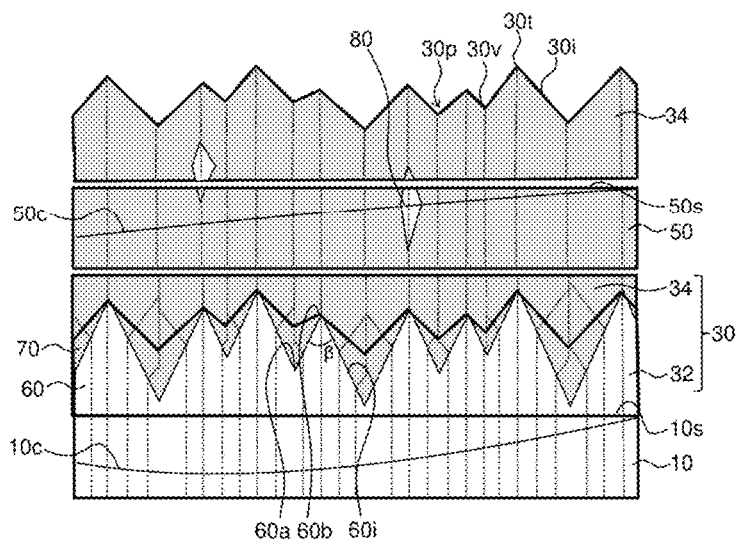

Thus, as illustrated in FIG. 5(a), growth of the three-dimensional growth layer 30 is continued over a predetermined thickness while the state in which the inclined interface growth region 70 occupies 80% or more of the area of a cross section taken along the main surface of the base substrate is maintained. As a result, the inclined interface maintaining layer 34 is formed on the expanded inclined interface layer 32.

Here, in order to reliably bend the propagation direction of dislocations in the three-dimensional growth step S200 as described above to lower the dislocation density, it is important that the c-plane 30c disappears at least once in a history of a growth interface at an arbitrary position in the three-dimensional growth layer 30. Therefore, it is desirable that the c-plane 30c disappears at least once in an early stage of the three-dimensional growth step S200 (e.g., in the inclined interface expansion step S220 described above).

However, the c-plane 30c may reappear in a part of the surface of the inclined interface maintaining layer 34 in the inclined interface maintenance step S240 after disappearing at least once. However, it is preferable to mainly expose the inclined interfaces 30i at the surface of the inclined interface maintaining layer 34 so that the ratio of an area occupied by the inclined interface growth region 70 in a cross section taken along the main surface of the base substrate is 80% or more as described above. If the ratio of the area occupied by the inclined interface growth region 70 in the cross section taken along the main surface of the base substrate is less than 80%, there is a possibility that cracks will be generated during growth. Also, there is a possibility that processing such as slicing and polishing will become difficult. However, in the present embodiment, the ratio of the area occupied by the inclined interface growth region 70 in the cross section taken along the main surface of the base substrate is 80% or more, and therefore, generation of cracks during growth can be suppressed, and processing such as slicing and polishing can be easily performed.

The higher the ratio of the area occupied by the inclined interface growth region 70 in the cross section is, the better, and it is preferable that the ratio is 100%.

However, in the three-dimensional growth step S200, the c-plane 30c may reappear, for example, in a part of the surface of the inclined interface maintaining layer 34 as described above and the ratio of an area occupied by the inclined interface growth region 70 in the cross section may be less than 100%. In this case, the inclined interface growth region 70 and a c-plane growth region (second c-plane growth region) 80 coexist in a portion of the three-dimensional growth layer 30. Oxygen, which is an n-type impurity, is relatively easily taken into the inclined interface growth region 70, but oxygen uptake is relatively suppressed in the coexisting c-plane growth region 80. Accordingly, the oxygen concentration in the c-plane growth region 80 is lower than the oxygen concentration in the inclined interface growth region 70, and a carrier concentration in the c-plane growth region 80 is lower than a carrier concentration in the inclined interface growth region 70. There is a possibility that the carrier concentration consequently will vary in a plane of the substrate 50 that is sliced from a region where the inclined interface growth region 70 and the c-plane growth region 80 coexist.

Therefore, in the three-dimensional growth step S200 of the present embodiment, it is preferable to add a conductive impurity at a concentration higher than or equal to the concentration of oxygen taken into the inclined interface growth region 70, for example. The conductive impurity is at least either of Si and Ge, which are n-type impurities, for example. For example, at least in the inclined interface maintenance step S240 of the three-dimensional growth step S200, the conductive impurity can be added at the concentration described above while the inclined interface maintaining layer 34 is grown at a position from which the substrate 50 is to be sliced. The conductive impurity may also be added to the whole three-dimensional growth layer 30 at the concentration described above. By adding the conductive impurity as described above, it is possible to keep the carrier concentration in the second c-plane growth region from becoming relatively low. As a result, it is possible to suppress the variation in the carrier concentration in a plane of the substrate 50.

Further, at this time, as a result of the inclined interface maintaining layer 34 being grown under the first growth condition with the inclined interfaces 30*i* mainly serving as growth surfaces, the dislocations that bend and propagate in the direction inclined with respect to the c-axis at positions where the inclined interfaces 30*i* are exposed in the inclined interface expanding layer 32 as described above continue to propagate in the same direction in the inclined interface maintaining layer 34. Thereby, the dislocations are collected locally at a meeting part of adjacent inclined interfaces 30*i* in the inclined interface maintaining layer 34. Out of a plurality of dislocations collected at meeting parts of adjacent inclined interfaces 30*i* of the inclined interface maintaining layer 34, dislocations that have Burgers vectors opposite to each other disappear when meeting each other. Further, some of the dislocations collected at the meeting parts of the adjacent inclined interfaces 30*i* form a loop, and the propagation along the c-axis (that is, toward the surface side of the inclined interface maintaining layer 34) is suppressed. The other dislocations of the plurality of dislocations collected at the meeting parts of the adjacent inclined interfaces 30*i* of the inclined interface maintaining layer 34 change their propagation direction again from the direction inclined with respect to the c-axis to a direction extending along the c-axis, and propagate to the surface side of the inclined interface maintaining layer 34. In this way, by making some of the plurality of dislocations disappear and suppressing propagation of some of the plurality of dislocations to the surface side of the c-plane expanded layer 42, the dislocation density in the surface of the inclined interface maintaining layer 34 can be lowered. Further, by collecting the dislocations locally, a low dislocation density region can be formed above a portion of the inclined interface maintaining layer 34 in which dislocations propagate in the direction inclined with respect to the c-axis.

In the inclined interface maintenance step S240, the inclined interface maintaining layer 34 has a thickness of 300 µm or more and 10 mm or less, in addition to the height from the valley 30*v* to the peak 30*t* of the expanded inclined interface layer 32, for example. When the thickness of the inclined interface maintaining layer 34 is 300 µm or more, at least one or more substrates 50 can be sliced from the inclined interface maintaining layer 34 in the slicing step S400, which will be described later. On the other hand, if the thickness of the inclined interface maintaining layer 34 is 10 mm, at least ten substrates 50 can be obtained when 700 µm-thick substrates 50 with a final thickness of 650 µm are sliced from the inclined interface maintaining layer 34, even if a kerf loss of about 200 µm is taken into account.

Note that so long as the growth in which the inclined interfaces 30*i* mainly serve as growth surfaces is maintained, the inclination angle formed by the inclined interfaces 30*i* with respect to the main surface 10*s* of the base substrate 10 does not necessarily have to be maintained at the surface of the inclined interface maintaining layer 34 at the last of the growth of the inclined interface maintaining layer 34. For example, at least some of the recessed portions 30*p* in the inclined interface maintaining layer 34 may be embedded at the last of the growth of the inclined interface maintaining layer 34. In this case, the inclination angle of the inclined interfaces 30*i* may be gradually made moderate and the index m of the {11−2m} plane may be gradually increased.

Through the three-dimensional growth step S200 described above, the three-dimensional growth layer 30 including the expanded inclined interface layer 32 and the inclined interface maintaining layer 34 is formed.

The inclined interface expansion step S220 and the inclined interface maintenance step S240 described above are continuously performed in the same chamber without exposing the base substrate 10 to the atmosphere. Thereby, it is possible to suppress unintended formation of a high oxygen concentration region (a region having an oxygen concentration that is excessively higher than that of the inclined interface growth region 70) at an interface between the expanded inclined interface layer 32 and the inclined interface maintaining layer 34.

S400: Slicing Step

Next, as illustrated in FIG. 5(*b*), for example, the three-dimensional growth layer 30 is sliced using a wire saw along a cut surface that is substantially parallel to the main surface 10*s* of the base substrate 10. Thereby, at least one nitride semiconductor substrate 50 (also referred to as the "substrate 50") as an as-sliced substrate is formed.

At this time, the thickness of the substrate 50 is, for example, 300 µm or more and 700 µm or less.

At this time, the substrate 50 is formed by slicing the inclined interface maintaining layer 34, for example. The inclined interface maintaining layer 34 is sliced at a position that is spaced upward from a position (i.e., the mountain 60*b* of the c-plane growth region 60) at which the c-plane growth region 60 continuous from the base substrate 10 finally disappeared, for example. Thus, it is possible to stably obtain the substrate 50 in which dislocations have been reduced.

At this time, the radius of curvature (absolute value thereof) of a c-plane 50*c* of the substrate 50 can be larger than the radius of curvature (absolute value thereof) of the c-plane 10c of the base substrate 10. Thereby, variation in the off-angle θ of a c-axis 50ca with respect to the normal of a main surface 50s of the substrate 50 can be made smaller than variation in the off-angle of the c-axis 10ca of the base substrate 10.

S500: Polishing Step

Next, both sides of the substrate 50 are polished using a polishing device. At this time, the final thickness of the substrate 50 is, for example, 250 µm or more and 650 µm or less.

The substrate 50 according to the present embodiment is manufactured by the above steps S100 to S500.

Step of Preparing Semiconductor Laminate and Step of Preparing Semiconductor Device After the substrate 50 is manufactured, for example, a semiconductor functional layer that is constituted by a group III nitride semiconductor is epitaxially grown on the substrate 50 to prepare a semiconductor laminate. After the semiconductor laminate is prepared, an electrode or the like is formed using the semiconductor laminate, and the semiconductor laminate is diced, and a chip having a predetermined size is cut out. Thereby, a semiconductor device is prepared.

(2) Laminated Structure

Next, a laminated structure 90 according to the present embodiment will be described with reference to FIG. 5(a).

The laminated structure 90 of the present embodiment includes, for example, the base substrate 10 and the three-dimensional growth layer 30.

The three-dimensional growth layer 30 grows on, for example, the main surface 10s of the base substrate 10.

The three-dimensional growth layer 30 is formed by generating a plurality of recessed portions 30p formed by inclined interfaces 30i other than the c-plane in the top surface 30u of a single crystal of a group III nitride semiconductor, for example, and making the c-plane 30c disappear at least once.

Further, the three-dimensional growth layer 30 includes, for example, the c-plane growth region (first low oxygen concentration region) 60 and the inclined interface growth region (high oxygen concentration region) 70 based on a difference in growth surfaces during the growth process.

The c-plane growth region 60 is a region that has grown with the c-plane 30c serving as the growth surface. As described above, oxygen uptake is suppressed in the c-plane growth region 60, as compared with the inclined interface growth region 70. Accordingly, the oxygen concentration in the c-plane growth region 60 is lower than the oxygen concentration in the inclined interface growth region 70. Specifically, the oxygen concentration in the c-plane growth region 60 is $5 \times 10^{16}$ cm$^{-3}$ or less, and preferably $3 \times 10^{16}$ cm$^{-3}$ or less.

Since the c-plane 30c disappears at least once, the c-plane growth region 60 is not continuous from the base substrate 10 to the surface (uppermost surface) of the three-dimensional growth layer 30.

The c-plane growth region 60 includes, for example, a plurality of valleys 60a and a plurality of mountains 60b in a cross-sectional view. Each of the valleys 60a and the mountains 60b referred to herein means a part of a shape that is observed based on a difference in light emission intensity when a cross section of the laminated structure 90 is observed using a fluorescence microscope or the like, and does not mean a part of the shape of an outermost surface generated during the growth of the three-dimensional growth layer 30. The plurality of valleys 60a are each an inflection point that is convex downward in the c-plane growth region 60 in the cross-sectional view, and are formed at positions at which the inclined interfaces 30i are generated. At least one (or all) of the plurality of valleys 60a is provided at a position that is spaced upward from the main surface 10s of the base substrate 10. On the other hand, the plurality of mountains 60b are each an inflection point that is convex upward in the c-plane growth region 60 in the cross-sectional view, and are formed at positions at which the c-plane 30c (finally) disappears, with a pair of inclined interfaces 30i that expand in opposite directions sandwiched between the positions. The valleys 60a and the mountains 60b are formed alternately in a direction extending along the main surface 10s of the base substrate 10.

When any cross section perpendicular to the main surface of the base substrate 10 is observed, an average distance between closest peaks during the growth process of the three-dimensional growth layer 30 corresponds to an average distance between the mountains 60b in the c-plane growth region 60. The average distance between the mountains 60b in the c-plane growth region 60 is, for example, more than 100 µm.

The c-plane growth region 60 includes a pair of inclined portions 60i that are formed on opposite sides of each of the plurality of mountains 60b as loci of intersections between the c-plane 30c and the inclined interfaces 30i. Each of the inclined portions 60i referred to herein means a part of the shape observed based on the difference in light emission intensity when the cross section of the laminated structure 90 is observed using a fluorescence microscope or the like, and does not mean the inclined interface 30i at the outermost surface generated during the growth of the three-dimensional growth layer 30.

An angle β formed by the pair of inclined portions 60i in a cross section taken along a plane that passes through centers of two adjacent valleys 60a is, for example, 70° or less, and preferably 20° or more and 65° or less. The angle β formed by the pair of inclined portions 60i being 70° or less means that under the first growth condition, the ratio $G_{c1}/G_i$ is high, which is the ratio of the growth rate $G_{c1}$ of the c-plane 30c of the three-dimensional growth layer 30 to the growth rate $G_i$ of the inclined interface 30i most inclined with respect to the c-plane 30c of the three-dimensional growth layer 30. Thereby, the inclined interfaces 30i other than the c-plane can be easily generated. As a result, dislocations can be easily bent at positions where the inclined interfaces 30i are exposed. Further, since the angle β formed by the pair of inclined portions 60i is 70° or less, a plurality of valleys 30v and a plurality of peaks 30t can be easily generated above the main surface 10s of the base substrate 10. Further, if the angle β formed by the pair of inclined portions 60i is 65° or less, the inclined interfaces 30i other than the c-plane can be generated more easily, and the plurality of valleys 30v and the plurality of peaks 30t can be generated more easily above the main surface 10s of the base substrate 10. Also, if the angle β formed by the pair of inclined portions 60i is 20° or more, it is possible to suppress an increase in the height from the valley 30v to the peak 30t of the three-dimensional growth layer 30. In this case, the number of regions in which penetrating pits are generated due to valleys 30v when the substrate 50 is sliced and thus a good substrate cannot be obtained can be reduced as much as possible.

On the other hand, the inclined interface growth region 70 is a region that has grown with the inclined interfaces 30i other than the c-plane serving as growth surfaces.

Oxygen is easily taken into the inclined interface growth region 70, as compared with the c-plane growth region 60. Accordingly, the oxygen concentration in the inclined interface growth region 70 is higher than the oxygen concentration in the c-plane growth region 60. The oxygen taken into the inclined interface growth region 70 is, for example, oxygen that is unintentionally introduced into a HVPE apparatus, oxygen that is released from a member (quartz member or the like) constituting the HVPE apparatus, or the like.

Specifically, the oxygen concentration in the inclined interface growth region 70 is, for example, $9 \times 10^{17}$ cm$^{-3}$ or more and $5 \times 10^{19}$ cm$^{-3}$ or less.

The inclined interface growth region 70 is provided on the c-plane growth region 60. A lower surface of the inclined interface growth region 70 conforms to the shape of the c-plane growth region 60, for example.

At least a portion of the inclined interface growth region 70 is provided continuously along the main surface of the base substrate 10. That is, when a plurality of cross sections of the three-dimensional growth layer 30 taken along the main surface 10s of the base substrate 10 are observed, it is desirable that there is a cross section that does not include the c-plane growth region, which has grown with the c-plane 30c serving as the growth surface, in at least a portion in a thickness direction of the three-dimensional growth layer 30.

As a result of the inclined interface maintaining layer 34 being continuously grown with the inclined interfaces 30i mainly serving as growth surfaces, the ratio of the area occupied by the inclined interface growth region 70 in a cross section of the three-dimensional growth layer 30 taken along the main surface 10s of the base substrate 10 is 80% or more, for example.

Note that the ratio of an area occupied by the inclined interface growth region 70 in a predetermined cross section taken along the main surface of the base substrate may be less than 100%, as described above. That is, there may be a cross section in which the inclined interface growth region 70 and the second c-plane growth region (corresponding to the c-plane growth region 80, which will be described later) coexist. The second c-plane growth region coexisting in the cross section has an oxygen concentration that is equivalent to the oxygen concentration in the c-plane growth region 60 described above.

The c-plane growth region 80 is generated and disappears during the growth process of the three-dimensional growth layer 30, and therefore, the size of the c-plane growth region 80 in a plan view randomly changes in the direction from the main surface 10s of the base substrate 10 toward the surface of the three-dimensional growth layer 30.

Also, the c-plane 30c disappears at least once during the growth process of the three-dimensional growth layer 30 as described above, and accordingly, similarly to the c-plane growth region 60, the c-plane growth region 80 is not continuous from the main surface 10s of the base substrate 10 to the surface (uppermost surface) of the three-dimensional growth layer 30.

Also, in the present embodiment, during the growth process of the three-dimensional growth layer 30, dislocations bend and propagate in a direction substantially perpendicular to the inclined interfaces 30i other than the c-plane at positions at which the inclined interfaces 30i are exposed. Therefore, in the inclined interface maintaining layer 34, some of the plurality of dislocations disappear, and some of the plurality of dislocations are kept from propagating toward the surface of the inclined interface maintaining layer 34. As a result, the dislocation density in the surface of the inclined interface maintaining layer 34 is lower than the dislocation density in the main surface 10s of the base substrate 10.

In addition, in the present embodiment, the entire surface of the three-dimensional growth layer 30 has +c-plane orientation, and the three-dimensional growth layer 30 does not include a polarity reversal domain (inversion domain). In this respect, the laminated structure 90 of the present embodiment is different from a laminated structure that is formed by a so-called DEEP (Dislocation Elimination by the Epitaxial-growth with inverse-pyramidal Pits) method, that is, different from a laminated structure including the polarity reversal domain in a core located at the center of a pit.

(3) Nitride Semiconductor Substrate (Nitride Semiconductor Free-Standing Substrate, Nitride Crystal Substrate)

Figure 7A:
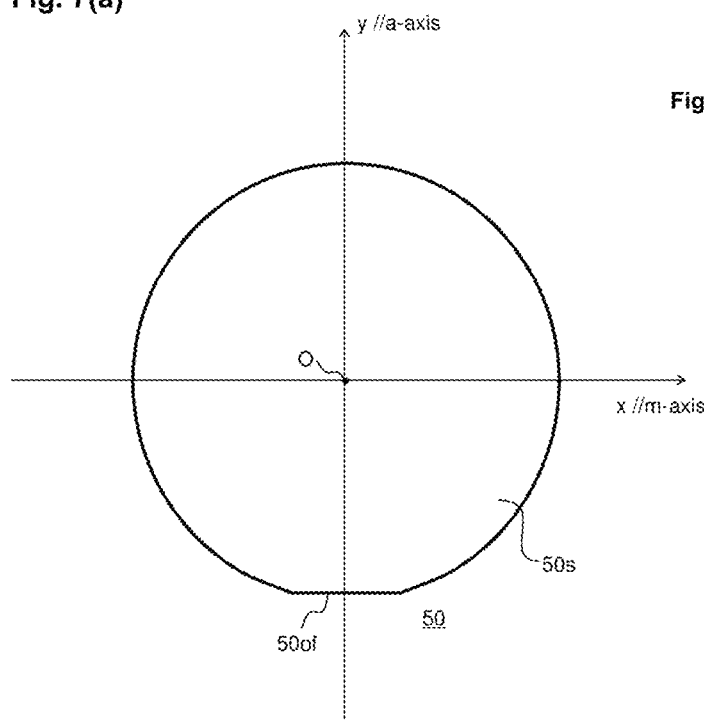
FIG. 7(a) is a schematic top view illustrating a nitride semiconductor substrate according to an embodiment of the present disclosure.
Figure 7C:
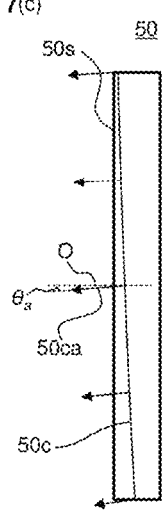
FIG. 7(c) is a schematic cross-sectional view taken along an a-axis of the nitride semiconductor substrate according to the embodiment of the present disclosure.
Figure 7B:
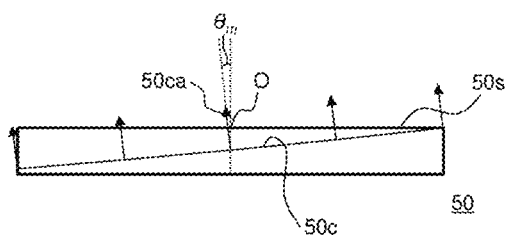
FIG. 7(b) is a schematic cross-sectional view taken along an m-axis of the nitride semiconductor substrate according to the embodiment of the present disclosure.
Figure 8:
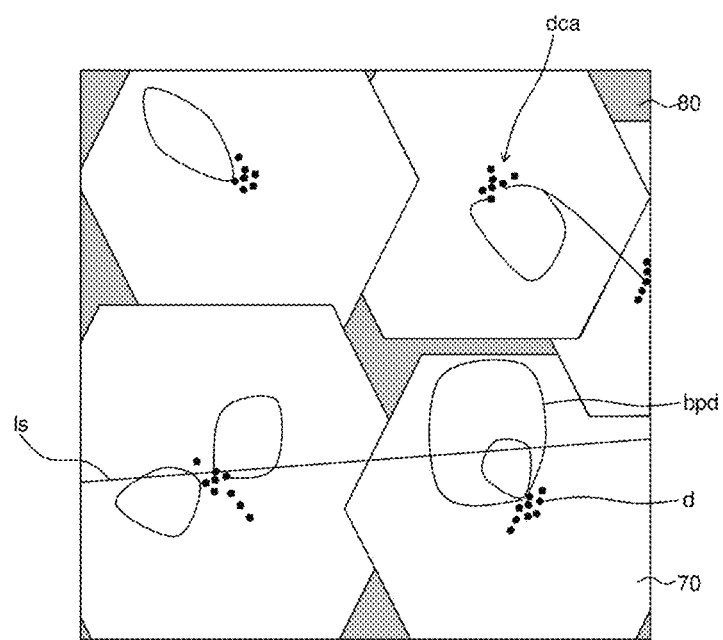
FIG. 8 is a schematic diagram showing a cathodoluminescence image of a main surface of the nitride semiconductor substrate according to the embodiment of the present disclosure, which was observed using a scanning electron microscope.

Next, the nitride semiconductor substrate 50 according to the present embodiment will be described with reference to FIGS. 7 and 8. FIG. 7(a) is a schematic top view illustrating the nitride semiconductor substrate according to the present embodiment, FIG. 7(b) is a schematic cross-sectional view taken along the m-axis of the nitride semiconductor substrate according to the present embodiment, and FIG. 7(c) is a schematic cross-sectional view taken along the a-axis of the nitride semiconductor substrate according to the present embodiment. FIG. 8 is a schematic diagram showing a cathodoluminescence image of the main surface of the nitride semiconductor substrate according to the present embodiment observed using a scanning electron microscope (SEM).

In the present embodiment, the substrate 50 obtained using the above-described manufacturing method is, for example, a free-standing substrate that is constituted by a single crystal of a group III nitride semiconductor. In the present embodiment, the substrate 50 is, for example, a GaN free-standing substrate.

The substrate 50 has a diameter of, for example, 2 inches or more. The substrate 50 has a thickness of, for example, 300 μm or more and 1 mm or less.

The substrate 50 has, for example, the main surface 50s which serves an epitaxial growth surface. In the present embodiment, a low index crystal plane that is closest to the main surface 50s is, for example, the c-plane 50c.

The main surface 50s of the substrate 50 is mirror-finished, for example, and a root mean square roughness RMS of the main surface 50s of the substrate 50 is, for example, less than 1 nm.

Further, in the present embodiment, the substrate 50 does not include, for example, the polarity reversal domain (inversion domain) as described above.

Inclined Interface Growth Region and c-Plane Growth Region

Next, characteristics of the main surface 50s of the substrate 50 will be described with reference to FIG. 8.

As illustrated in FIG. 8, the substrate 50 includes, for example, the inclined interface growth region (high oxygen concentration region) 70 that has grown with the inclined interfaces 30i serving as growth surfaces. As described above, the oxygen concentration in the inclined interface growth region 70 is $9 \times 10^{17}$ cm$^{-3}$ or more and $5 \times 10^{19}$ cm$^{-3}$ or less, for example.

The inclined interface growth region 70 contains oxygen at a high concentration as described above, and therefore, the inclined interface growth region 70 is observed to be relatively bright in a cathodoluminescence image (CL image) (or a multiphoton excitation microscope image (2PPL image)) taken at least in a wavelength range that includes at least some wavelengths of light emission near the band-gap energy of the group III nitride semiconductor.

The shape of the inclined interface growth region 70 in a plan view reflects shapes, in a plan view, of the recessed portions 30p generated during the growth process of the three-dimensional growth layer 30, and includes at least portions of substantially hexagonal shapes, for example. In the shape of the inclined interface growth region 70 in a plan view, the outline of a substantially hexagonal shape may intersect the outline of another substantially hexagonal shape. In a 2PPL image, ridges of the recessed portions 30p generated during the growth process of the three-dimensional growth layer 30 may be seen in the inclined interface growth region 70.

In the present embodiment, the ratio of an area occupied by the inclined interface growth region 70 in the main surface 50s is 80% or more, for example. In other words, the c-plane growth region (second c-plane growth region, surface-side c-plane growth region, low oxygen concentration region) 80 may be present in the main surface 50s at an area ratio of 20% or less.

As described above, the c-plane growth region 80 is a region in which the c-plane 30c reappeared in the inclined interface maintaining layer 34. The oxygen concentration in the c-plane growth region 80 is, for example, $5\times10^{16}$ cm$^{-3}$ or less, and preferably $3\times10^{16}$ cm$^{-3}$ or less.

The size of the c-plane growth region 80 in a plan view randomly changes in the direction from a back surface of the substrate 50, which is opposite to the main surface 50s, toward the main surface 50s of the substrate 50, for example.

The c-plane growth region 80 is not continuous from the back surface of the substrate 50, which is opposite to the main surface 50s, to the main surface 50s, for example.

On the other hand, the ratio of an area occupied by the inclined interface growth region 70 in the main surface 50s may be 100%, i.e., a configuration is also possible in which the substrate 50 does not include the c-plane growth region 80.

Based on the ratio of an area occupied by the inclined interface growth region 70 in the main surface 50s, an average oxygen concentration in the entire main surface 50s of the substrate 50 is $7\times10^{17}$ cm$^{-3}$ or more and $5\times10^{10}$ cm$^{-3}$ or less, for example.

In the present embodiment, the substrate 50 obtained using the above-described manufacturing method is an n-type substrate, for example. The substrate 50 in the present embodiment includes, as n-type impurities, not only oxygen (O) described above, but also at least one of Si and Ge. A total concentration of n-type impurities in the substrate 50 is $1.0\times10^{18}$ cm$^{-3}$ or more and $1.0\times10^{20}$ cm$^{-3}$ or less, for example.

In the substrate 50 of the present embodiment, not only at least one of Si and Ge, but also O is activated. Accordingly, the concentration of free electrons in the substrate 50 is equivalent to the total concentration of O, Si, and Ge in the substrate 50, for example.

Note that in the present embodiment, concentrations of impurities other than the n-type impurities (conductive impurities) in the substrate 50 obtained using the above-described manufacturing method are low.

For example, a hydrogen concentration in the substrate 50 obtained using the above-described manufacturing method is lower than that in a substrate obtained using a flux method, an ammonothermal method, or the like.

Specifically, the hydrogen concentration in the substrate 50 is, for example, less than $1\times10^{17}$ cm$^{-3}$, and preferably $5\times10^{16}$ cm$^{-3}$ or less.

Dark Spots

Next, dark spots on the main surface 50s of the substrate 50 of the present embodiment will be described using FIG. 8. The "dark spots" referred to herein means points at which the light emission intensity is low in an observation image of the main surface 50s observed using a multiphoton excitation microscope, a cathodoluminescence image of the main surface 50s, or the like, and includes not only dislocations but also non-light-emissive centers due to foreign matters or point defects. The "multiphoton excitation microscope" is sometimes called a two-photon excitation fluorescence microscope.

In the present embodiment, since the substrate 50 is manufactured using the base substrate 10 constituted by a high-purity GaN single crystal prepared by the VAS method, there are few non-light-emissive centers due to foreign matters or point defects in the substrate 50.

Accordingly, as illustrated in FIG. 8, 95% or more, and preferably 99% or more of dark spots in a CL image (or 2PPL image) of the main surface 50s of the substrate 50 are dislocations (penetrating dislocations) d, rather than non-light-emissive centers due to foreign matters or point defects.

Further, in the present embodiment, due to the above-described manufacturing method, dislocations are locally collected in the inclined interface maintaining layer 34, and the dislocation density in the surface of the inclined interface maintaining layer 34 is lower than the dislocation density in the main surface 10s of the base substrate 10. Therefore, the dislocation density is also lowered in the main surface 50s of the substrate 50 formed by slicing the inclined interface maintaining layer 34.

Also, in the present embodiment, as illustrated in FIG. 8, dislocations d are locally concentrated at centers of substantially hexagonal shapes in the inclined interface growth region 70 due to the above-described manufacturing method. In the following description, a region in the inclined interface growth region 70 in which dislocations d are relatively concentrated will also be referred to as a "dislocation concentrated region dca". A wide low dislocation density region is formed outside the dislocation concentrated region dca.

In the above-described manufacturing method of the present embodiment, the three-dimensional growth step S200 is performed using the base substrate 10 on which patterning has not been performed, and therefore, the main surface 50s of the substrate 50 formed by slicing the three-dimensional growth layer 30 does not include high dislocation density regions that would be regularly generated due to patterning performed on the base substrate 10. In other words, even if the substrate 50 of the present embodiment includes dislocation concentrated regions dca, the dislocation concentrated regions dca are randomly arranged. Also, the dislocation density in the dislocation concentrated regions dca of the substrate 50 of the present embodiment is lower than the dislocation density of a case where patterning is performed on the base substrate 10.

Specifically, in the present embodiment, when a dislocation density is determined based on a dark spot density by observing the main surface 50s of the substrate 50 using a multiphoton excitation microscope in a field of view that is 250 μm square, there is no region that has a dislocation density higher than $3\times10^6$ cm$^{-2}$. Also, regions having a dislocation density lower than $1\times10^6$ cm$^{-2}$ constitute 80% or more, preferably 90% or more, and more preferably 95% or more of the main surface 50s. Note that when a cathodoluminescence image is observed, results similar to those obtained using the multiphoton excitation microscope are obtained.

In the case where the manufacturing method of the present embodiment is used, an upper limit of the ratio of regions that have a dislocation density lower than $1 \times 10^6$ cm$^{-2}$ is, for example, 99% of the main surface 50s.

In other words, in the present embodiment, a dislocation density determined by averaging the entire main surface 50s of the substrate 50 is, for example, less than $1 \times 10^6$ cm$^{-2}$, preferably less than $5.5 \times 10^5$ cm$^{-2}$, and more preferably $3 \times 10^5$ cm$^{-2}$ or less.

Further, the main surface 50s of the substrate 50 of the present embodiment includes, for example, dislocation-free regions that are at least 50 μm square based on the average distance L between closest peaks in the three-dimensional growth step S200 described above. Further, 50 μm square dislocation-free regions are scattered over the entire main surface 50s of the substrate 50 excluding the dislocation concentrated regions dca described above, for example. Further, the main surface 50s of the substrate 50 of the present embodiment includes, for example, 50 μm square dislocation-free regions that do not overlap each other, at a density of 100 regions/cm$^2$ or more, preferably 800 regions/cm$^2$ or more, and more preferably 1600 regions/cm$^2$ or more. The case where the density of 50 μm square dislocation-free regions that do not overlap each other is 1600 regions/cm$^2$ or more corresponds to, for example, a case where the main surface 50s includes at least one 50 μm square dislocation-free region in any field of view that is 250 μm square.

An upper limit of the density of 50 μm square dislocation-free regions that do not overlap each other is about 30,000 regions/cm$^2$, for example.

For reference, in the case of a substrate that is obtained by a conventional manufacturing method in which a special process for collecting dislocations is not performed, the size of dislocation-free regions is smaller than 50 μm square, or the density of 50 μm square dislocation-free regions is lower than 100 regions/cm$^2$. In a substrate obtained by a conventional ELO method as well, the size of dislocation-free regions is smaller than 50 μm square, or the density of 50 μm square dislocation-free regions is lower than 100 regions/cm$^2$.

In the present embodiment, even when the substrate 50 includes the c-plane growth region 80 as described above, the c-plane 30c disappears at least once during the growth process of the three-dimensional growth layer 30, and dislocations are bent below the main surface 50s side c-plane growth region 80. Therefore, the c-plane growth region 80 in the main surface 50s may include the above-described dislocation-free region that is at least 50 μm square, for example.

In the present embodiment, the dislocation density in the dislocation concentrated regions dca is low as described above, and accordingly, when the main surface 50s is observed using a multiphoton excitation microscope in a field of view that is 50 μm square and includes a dislocation concentrated region dca, the dislocation density is less than $3 \times 10^6$ cm$^{-2}$, for example. Since it is thought that at least one dark spot is present in the field of view that is 50 μm square and includes a dislocation concentrated region dca, a lower limit of the dislocation density in the field of view that is 50 μm square and includes a dislocation concentrated region dca is $4 \times 10^4$ cm$^{-2}$, for example.

Basal Plane Dislocations

Next, basal plane dislocations bpd in the main surface 50s of the substrate 50 of the present embodiment will be described using FIG. 8.

In the present embodiment, crystal strain may be applied to the three-dimensional growth layer 30 due to a stress offset effect of the inclined interface growth region 70, which will be described later, and basal plane dislocations may be generated. Therefore, as illustrated in FIG. 8, basal plane dislocations bpd may be observed in a CL image of the main surface 50s of the substrate 50 formed by slicing the three-dimensional growth layer 30.

However, in the present embodiment, the number of basal plane dislocations bpd in the main surface 50s of the substrate 50 is small as compared with, for example, a substrate obtained by an ELO method in which a mask layer is used.

Specifically, when an imaginary line segment 1s having a length of 200 μm is arbitrarily drawn in a CL image of the main surface 50s, the number of intersections between the line segment 1s and basal plane dislocations bpd is, for example, no greater than 10, and preferably no greater than 5. The minimum value of the number of intersections between the line segment 1s and basal plane dislocations bpd is 0, for example.

Burgers Vector

Next, the Burgers vector of the dislocations in the substrate 50 of the present embodiment will be described.

In the present embodiment, the dislocation density in the main surface 10s of the base substrate 10 used in the above-described manufacturing method is low, and therefore, a plurality of dislocations are less likely to be combined (mixed) when the three-dimensional growth layer 30 is grown on the base substrate 10. This makes it possible to suppress the formation of dislocations having a large Burgers vector in the substrate 50 obtained from the three-dimensional growth layer 30.

Specifically, in the substrate 50 of the present embodiment, for example, the Burgers vector of most of the dislocations is any of <11–20>/3, <0001>, and <11–23>/3. The "Burgers vector" referred to herein can be measured by, for example, a large-angle convergent-beam electron diffraction method (LACBED method) using a transmission electron microscope (TEM). Dislocations whose Burgers vector is <11–20>/3 are edge dislocations, dislocations whose Burgers vector is <0001> are screw dislocations, and dislocations whose Burgers vector is <11–23>/3 are mixed dislocations in which edge dislocations and screw dislocations are mixed.

In the present embodiment, when 100 dislocations in the main surface 50s of the substrate 50 are extracted at random, a percentage of dislocations whose Burgers vector is any of <11–20>/3, <0001>, and <11–23>/3 is, for example, 50% or more, preferably 70% or more, and more preferably 90% or more. Dislocations whose Burgers vector is 2 <11–20>/3, <11–20>, or the like may be present in at least a part of the main surface 50s of the substrate 50.

Radius of Curvature of c-Plane

Next, the radius of curvature of the c-plane 50c of the substrate 50 of the present embodiment will be described using FIG. 7.

As illustrated in FIGS. 7(b) and 7(c), in the present embodiment, the c-plane 50c, which is the low index crystal plane closest to the main surface 50s of the substrate 50, is flat or curved in a spherical shape due to the above-described method for manufacturing the substrate 50, for example. The c-plane 50c of the substrate 50 may be curved in a concave spherical shape or a convex spherical shape with respect to the main surface 50s, for example. Alternatively, in a case where the c-plane 50c of the substrate 50 is substantially flat, for example, the c-plane 50c may include a portion that is curved in a concave spherical shape with respect to the main surface 50s and a portion that is curved in a convex spherical shape with respect to the main surface 50s.

In the present embodiment, the c-plane 50c of the substrate 50 has, for example, a flat surface or a curved surface that approximates to a spherical surface in each of a cross section taken along the m-axis and a cross section taken along the a-axis.

Here, the coordinate of a position in the main surface 50s of the substrate 50 in a direction extending along the m-axis is represented by "x". On the other hand, the coordinate of the position in the main surface 50s of the substrate 50 in a direction extending along the a-axis is represented by "y". Coordinates (x,y) of the center of the main surface 50s of the substrate 50 are taken to be (0,0). In the off-angle θ formed by the c-axis 50ca with respect to the normal of the main surface 50s, a directional component extending along the m-axis is represented by "Om", and a directional component extending along the a-axis is represented by "$O_a$". Note that the following equation holds true: $\theta^2 = \theta_m^2 \theta_a^2$.

In the present embodiment, since the c-plane 50c of the substrate 50 is flat or curved like a spherical surface as described above, the off-angle m-axis component Om and the off-angle a-axis component $\theta_a$ can be represented approximately by a linear function of x and a linear function of y, respectively.

Specifically, when X-ray rocking curve measurement of the (0002) plane is performed at positions on a straight line that passes through the center in the main surface 50s, for example, and a peak angle ω formed between the main surface 50s and X rays incident on the main surface 50s is plotted for the positions on the straight line, the peak angle ω can be approximated by a linear function of the positions. Note that the "peak angle ω" referred to here is an angle that is formed between the main surface 50s and X rays incident on the main surface 50s and at which diffraction intensity is at the maximum. The radius of curvature of the c-plane 50c can be determined based on the reciprocal of the slope of the linear function approximated as described above.

In the present embodiment, the radius of curvature of the c-plane 50c of the substrate 50 is larger than, for example, the radius of curvature of the c-plane 10c of the base substrate 10 used in the above-described method for manufacturing the substrate 50.

Specifically, when the peak angle ω is approximated by a linear function of positions in X-ray rocking curve measurement of the c-plane 50c, the radius of curvature of the c-plane 50c determined based on the reciprocal of the slope of the linear function is, for example, 15 m or more, preferably 23 m or more, more preferably 30 m or more, and further preferably 40 m or more.

In the present embodiment, an upper limit of the radius of curvature of the c-plane 50c of the substrate 50 is not particularly limited, because the larger, the better. When the c-plane 50c of the substrate 50 is substantially flat, the radius of curvature of the c-plane 50c can be considered infinite.

In the present embodiment, since the radius of curvature of the c-plane 50c of the substrate 50 is large, variation in the off-angle θ of the c-axis 50ca with respect to the normal of the main surface 50s of the substrate 50 can be smaller than variation in the off-angle of the c-axis 10ca of the base substrate 10.

Also, in the present embodiment, when the peak angle ω is approximated by the linear function of positions in the X-ray rocking curve measurement of the c-plane 50c, an error of ω with respect to the linear function is small as compared with, for example, a substrate obtained by an ELO method in which a mask layer is used.

Specifically, an error of a measured peak angle ω with respect to the linear function approximated as described above is, for example, no greater than 0.05°, preferably no greater than 0.02°, and more preferably no greater than 0.01°. At least some peak angles ω may match the linear function, and accordingly, the minimum value of the error is 0°.

Photoluminescence Characteristics of Semiconductor Laminate

Next, photoluminescence characteristics of a semiconductor layer when a semiconductor laminate is manufactured using the substrate 50 will be described.

In the present embodiment, the substrate 50 includes the inclined interface growth region 70 having a high oxygen concentration as described above, but when a semiconductor laminate is manufactured using the substrate 50, crystal strain due to the substrate 50 hardly occurs in a semiconductor layer that is grown on the substrate 50. Therefore, in the photoluminescence of the semiconductor layer grown on the substrate 50, a peak shift due to crystal strain in the semiconductor layer is small or does not occur.

Specifically, the following characteristics are achieved. First, a laminate is prepared by epitaxially growing a semiconductor layer that is constituted by a non-doped single crystal of a predetermined group III nitride semiconductor on the main surface 50s of the substrate 50, and a reference laminate is prepared by epitaxially growing a semiconductor layer on a substrate that is constituted by a single crystal of a group III nitride semiconductor that is the same as the substrate 50 in all aspects other than not including the inclined interface growth region 70 (i.e., a non-doped single crystal of the same group III nitride semiconductor as the substrate 50). Note that the term "non-doped" used here means that the semiconductor does not contain an intentionally-added impurity, and encompasses a case where the semiconductor contains inevitable impurities. Next, photoluminescence of the semiconductor layers in the laminate according to the present embodiment and the reference laminate is measured with a temperature difference of less than 1° C. (e.g., at 27° C.). In this case, a difference between the maximum peak wavelength in the semiconductor layer of the laminate according to the present embodiment and the maximum peak wavelength in the semiconductor layer of the reference laminate is no greater than 1 nm, for example.

(4) Effects Achieved by the Present Embodiment

According to the present embodiment, one or more of the following effects can be achieved.

(a) By generating the inclined interfaces 30i other than the c-plane in the surface of the single crystal constituting the three-dimensional growth layer 30 in the three-dimensional growth step S200, it is possible to bend dislocations and make the dislocations propagate in a direction that is substantially perpendicular to the inclined interfaces 30i at positions where the inclined interfaces 30i are exposed. Thus, the dislocations can be locally collected. As a result of the dislocations being locally collected, dislocations that have Burgers vectors opposite to each other disappear. Alternatively, as a result of the locally collected dislocations forming a loop, the dislocations can be kept from propagating to the surface side of the three-dimensional growth layer 30. Thus, the dislocation density in the surface of the three-dimensional growth layer 30 can be lowered. As a result, the substrate 50 having a lower dislocation density than the base substrate 10 can be obtained.

(b) In the three-dimensional growth step S200, the c-plane 30c disappears at least once from the top surface 30u of the three-dimensional growth layer 30. As a result, dislocations propagating from the base substrate 10 can be reliably bent at positions where the inclined interfaces 30i in the three-dimensional growth layer 30 are exposed.

Here, a case where the c-plane remains in the three-dimensional growth step will be considered. In this case, in portions where the c-plane remains, the dislocations propagating from the base substrate propagate substantially vertically upward without being bent and reach the surface of the three-dimensional growth layer. Therefore, the dislocations are not reduced and high dislocation density regions are formed above the portions where the c-plane remains.

In contrast, according to the present embodiment, since the c-plane 30c disappears at least once from the top surface 30u of the three-dimensional growth layer 30 in the three-dimensional growth step S200, the surface of the three-dimensional growth layer 30 can be constituted only by the inclined interfaces 30i other than the c-plane at least once. Therefore, the dislocations propagating from the base substrate 10 can be reliably bent over the entire surface of the three-dimensional growth layer 30. Since the dislocations are reliably bent, some of the plurality of dislocations are likely to disappear, or some of the plurality of dislocations are unlikely to propagate to the surface side of the three-dimensional growth layer 30. As a result, the dislocation density can be lowered over the entire main surface 50s of the substrate 50 obtained from the three-dimensional growth layer 30.

(c) In the three-dimensional growth step S200, after the c-plane 30c has disappeared from the surface of the three-dimensional growth layer 30, growth of the three-dimensional growth layer 30 is continued over a predetermined thickness while the state in which the inclined interface growth region 70 occupies 80% or more of the area of a cross section taken along the main surface of the base substrate is maintained. Thus, a sufficient time can be secured to bend the dislocations at positions where the inclined interfaces 30i are exposed. Here, if the c-plane grows immediately after disappearing, there is a possibility that the dislocations are not sufficiently bent and propagate in the substantially vertical direction toward the surface of the three-dimensional growth layer. In contrast, according to the present embodiment, since sufficient time is secured to bend the dislocations at positions where the inclined interfaces 30i other than the c-plane are exposed, the dislocations can be kept from propagating in the substantially vertical direction from the base substrate 10 toward the surface of the three-dimensional growth layer 30. Thereby, concentration of the dislocations in the three-dimensional growth layer 30 can be suppressed.

(d) In the present embodiment, the c-plane 50c of the substrate 50 can have a larger radius of curvature than the c-plane 10c of the base substrate 10 because the three-dimensional growth layer 30 is sliced.

One of reasons why the radius of curvature of the c-plane 50c of the substrate 50 is large can be considered as follows, for example.

As described above, in the three-dimensional growth step S200, the inclined interface growth region 70 is formed by growing the three-dimensional growth layer 30 with the inclined interfaces 30i other than the c-plane serving as growth surfaces. Oxygen is easily taken into the inclined interface growth region 70, as compared with the c-plane growth region 60. Accordingly, the oxygen concentration in the inclined interface growth region 70 is higher than the oxygen concentration in the c-plane growth region 60. That is, the inclined interface growth region 70 can be considered as being a high oxygen concentration region.

By taking oxygen into the high oxygen concentration region as described above, the lattice constant of the high oxygen concentration region can be made larger than the lattice constant of regions other than the high oxygen concentration region (reference: Chris G. Van de Walle, Physical Review B vol. 68, 165209 (2003)). Due to the curvature of the c-plane 10c of the base substrate 10, stress that is concentrated toward the center of curvature of the c-plane 30c is applied to the base substrate 10 or the c-plane growth region 60 of the three-dimensional growth layer 30, which has grown with the c-plane 30c serving as the growth surface. In contrast, by making the lattice constant in the high oxygen concentration region relatively large, stress can be generated in the high oxygen concentration region so as to spread the c-plane 30c outward in a direction extending along the surface. Thereby, the stress concentrated toward the center of curvature of the c-plane 30c under the high oxygen concentration region can be offset by the stress that causes the c-plane 30c in the high oxygen concentration region to spread outward in the direction extending along the surface (hereinafter this will be referred to as a "stress offset effect" of the high oxygen concentration region). As a result, the radius of curvature of the c-plane 50c of the substrate 50 can be made larger than the radius of curvature of the c-plane 10c of the base substrate 10.

(e) By growing the three-dimensional growth layer 30 with the inclined interfaces 30i serving as growth surfaces in the three-dimensional growth step S200, the growth rate of the three-dimensional growth layer 30 can be made high, as compared with a case where a semiconductor layer is grown with a c-plane serving as the growth surface. As a result, the throughput can be improved in the manufacture of the substrate 50.

(f) By making the inclined interface growth region 70 occupy 80% or more of the area of a cross section taken along the main surface of the base substrate in the three-dimensional growth step S200, the stress offset effect of the three-dimensional growth layer 30 can be exhibited as described above. Therefore, generation of cracks during the growth of the three-dimensional growth layer 30 can be suppressed. As a result, the three-dimensional growth layer 30 can be easily grown to be thick.

(g) By making the inclined interface growth region 70 occupy 80% or more of the area of a cross section taken along the main surface of the base substrate in the three-dimensional growth step S200, processing such as slicing and polishing can be easily performed, as compared with a case where the c-plane growth region occupies a wide area.

As described above in (a) to (g), the substrate 50 having good crystal quality can be obtained easily and stably according to the present embodiment.

(h) In the initial stage of the three-dimensional growth step S200 in which the expanded inclined interface layer 32 grows, the expanded inclined interface layer 32 is two-dimensionally grown to a predetermined thickness with the c-plane 30c serving as the growth surface, and thereafter the plurality of recessed portions 30p are generated in the top surface 30u of the expanded inclined interface layer 32. In other words, the expanded inclined interface layer 32 (initial layer) that has a mirror-finished surface is formed so as to have the predetermined thickness before the expanded inclined interface layer 32 starts to three-dimensionally grow. Therefore, the inclined interfaces 30*i* stably appear uniformly in a plane of the three-dimensional growth layer 30 in the three-dimensional growth step S200. As a result, the dislocation density can be lowered over the entire surface of the three-dimensional growth layer 30.

Furthermore, the crystal axis can be made uniform over the entire main surface 10*s* of the base substrate 10 as a result of the plurality of recessed portions 30*p* being generated in the top surface 30*u* of the expanded inclined interface layer 32 after the expanded inclined interface layer 32 is two-dimensionally grown so as to have the predetermined thickness with the c-plane 30*c* serving as the growth surface in the initial stage of the three-dimensional growth step S200. Therefore, generation of new dislocations due to misalignment between crystal axes can be suppressed. As a result, the dislocation density can be lowered.

For reference, the following considers a case where an amorphous buffer layer is gown on the base substrate at a low temperature, and thereafter an epilayer is three-dimensionally grown by raising the temperature. In this case, the buffer layer changes from the amorphous layer to a polycrystal while the temperature is raised to a growth temperature of the epilayer. In the following growth of the epilayer, the epilayer grows in the manner of islands on the polycrystal buffer layer. Crystal axes of crystals that are grown in the manner of islands on the polycrystal vary from each other. Therefore, when the island-like crystals further grow and meet each other, new dislocations are generated due to misalignment between crystal axes. As a result, the dislocation density may be high in the epilayer.

(i) In the present embodiment, since the base substrate 10 described above is used and the first growth condition is adjusted so as to satisfy the formula (1), {11–2m} planes satisfying m≥3 can be generated as the inclined interfaces 30*i* in the three-dimensional growth step S200. Thereby, an inclination angle of the {11–2m} plane with respect to the c-plane 30*c* can be made moderate. Specifically, the inclination angle can be 47.3° or less. Since the inclination angle of the {11–2m} plane with respect to the c-plane 30*c* is moderate, a cycle of the plurality of peaks 30*t* can be lengthened. Specifically, the average distance L between closest peaks can be more than 100 μm when any cross section perpendicular to the main surface 10*s* of the base substrate 10 is observed.

For reference, when an etch pit is generated in a nitride semiconductor substrate using a predetermined etchant, an etch pit that is constituted by a {1–10n} plane is usually formed in the surface of the substrate. In contrast, {11–2m} planes satisfying m≥3 can be generated in the surface of the three-dimensional growth layer 30 grown under a predetermined condition in the present embodiment. Accordingly, it is considered that the inclined interfaces 30*i* peculiar to the manufacturing method are formed in the present embodiment as compared with the usual etch pit.

(j) In the present embodiment, when any cross section perpendicular to the main surface 10*s* of the base substrate 10 is observed, the average distance L between closest peaks is more than 100 μm, and therefore, at least a distance longer than 50 μm can be secured for the dislocations to bend and propagate. Therefore, the dislocations can be sufficiently collected above substantially the center between each pair of peaks 30*t* of the three-dimensional growth layer 30. As a result, the dislocation density in the surface of the three-dimensional growth layer 30 can be sufficiently lowered.

(k) In the slicing step S400, the substrate 50 is formed by slicing the inclined interface maintaining layer 34. The inclined interface maintaining layer 34 is sliced at a position that is spaced upward from a position at which the c-plane growth region 60 continuous from the base substrate 10 finally disappears. Therefore, a portion of the three-dimensional growth layer 30 that grew during the process of collecting dislocations can be avoided. As a result, it is possible to stably obtain the substrate 50 in which the dislocations have been reduced.

<Other Embodiments>

An embodiment of the present disclosure has been specifically described. However, the present disclosure is not limited to the above-described embodiment, and various modifications can be made without departing from the gist thereof.

In the above-described embodiment, explanation is given for the case where the base substrate 10 is a GaN free-standing substrate, but the base substrate 10 is not limited to the GaN free-standing substrate, and for example, may be a free-standing substrate constituted by a group III nitride semiconductor such as aluminum nitride (AlN), aluminum gallium nitride (AlGaN), indium nitride (InN), indium gallium nitride (InGaN), or aluminum indium gallium nitride (AlInGaN), that is, a free-standing substrate constituted by a group III nitride semiconductor represented by a composition formula of $Al_xIn_yGa_{1-x-y}N$ (0≤x≤1, 0≤y≤1, 0≤x+y≤1).

In the above-described embodiment, explanation is given for the case where the substrate 50 is a GaN free-standing substrate, but the substrate 50 is not limited to the GaN free-standing substrate, and for example, may be a free-standing substrate constituted by a group III nitride semiconductor such as AlN, AlGaN, InN, InGaN, or AlInGaN, that is, a free-standing substrate constituted by a group III nitride semiconductor represented by a composition formula of $Al_xIn_yGa_{1-x-y}N$ (0≤x≤1, 0≤y≤1, 0≤x+y≤1).

In the above-described embodiments, explanation is given for the case where the substrate 50 is n-type, but the substrate 50 may be p-type or may have semi-insulating properties. For example, when manufacturing a semiconductor device as a high electron mobility transistor (HEMT) using the substrate 50, the substrate 50 preferably has semi-insulating properties.

In the above-described embodiment, the growth temperature is mainly adjusted as the first growth condition in the three-dimensional growth step S200, but a growth condition other than the growth temperature may be adjusted, or the growth temperature and another growth condition may be adjusted in combination, as the first growth condition so long as the first growth condition satisfies the formula (1).

In the above-described embodiment, explanation is given for the case where the first growth condition is maintained in the inclined interface maintenance step S240 similarly to the inclined interface expansion step S220, but the growth condition in the inclined interface maintenance step S240 may be different from the growth condition in the inclined interface expansion step S220 so long as the growth condition in the inclined interface maintenance step S240 satisfies the first growth condition.

In the above-described embodiment, explanation is given for the case where the second crystal layer 6 or the inclined interface maintaining layer 34 is sliced using a wire saw in the slicing step S170 and the slicing step S400, but for example, an outer peripheral blade slicer, an inner peripheral blade slicer, an electric discharge machine, or the like may be used.

In the above-described embodiment, explanation is given for the case where the substrate 50 is obtained by slicing the inclined interface maintaining layer 34 in the laminated structure 90, but the present disclosure is not limited thereto.

For example, the laminated structure 90 may be used as is to manufacture a semiconductor laminate for manufacturing a semiconductor device.

Specifically, after preparing the laminated structure 90, in the semiconductor laminate manufacturing step, a semiconductor functional layer is epitaxially grown on the laminated structure 90 to prepare a semiconductor laminate. After preparing the semiconductor laminate, a back surface side of the laminated structure 90 is polished to remove the base substrate 10 and the expanded inclined interface layer 32 from the laminated structure 90. Thereby, a semiconductor laminate that includes the inclined interface maintaining layer 34 and the semiconductor functional layer can be obtained as in the above-described embodiment. In this case, the slicing step S400 and the polishing step S500 for obtaining the substrate 50 can be omitted.

EXAMPLES

Hereinafter, various experimental results supporting the effects of the present disclosure will be described.
(1) Experiment 1
(1-1) Preparation of Nitride Semiconductor Substrate Nitride semiconductor substrates of an example and a comparative example were prepared as follows. As for the example, a laminated structure from which the nitride semiconductor substrate was sliced was also prepared. In the following, the "nitride semiconductor substrate" may be abbreviated as the "substrate".
[Conditions for Preparing Nitride Semiconductor Substrate of Example]
(Base Substrate)
    Material: GaN
    Manufacturing method: VAS method
    Diameter: 2 inches
    Thickness: 550 μm
    Low index crystal plane closest to the main surface: c-plane
    No pattern processing such as formation of a mask layer was performed on the main surface.
(Three-Dimensional Growth Layer)
    Material: GaN
    Growth method: HVPE method
    First growth condition:
    Growth temperature was 980° C. or more and 1,020° C. or less, and the V/III ratio was 2 or more and 20 or less. At this time, at least either the growth temperature or the V/III ratio was adjusted within the above-described ranges such that the first growth condition satisfied the formula (1).
    Thickness of three-dimensional growth layer: about 1.45 mm
(Slicing Condition)
    Thickness of nitride semiconductor substrate: 400 μm
    Kerf loss: 200 μm
    In the example, two substrates (A and B) that were sliced from different positions were prepared. The substrate B was sliced from a position closer to the base substrate than the substrate A was.
(Polishing Condition)
    Polishing thickness: 200 μm
[Conditions for Preparing Nitride Semiconductor Substrate of Comparative Example]
(Base Substrate)
    Material: GaN
    Manufacturing method: VAS method
    Diameter: 2 inches
    Thickness: 400 μm
    Low index crystal plane closest to the main surface: c-plane
    No pattern processing such as formation of a mask layer was performed on the main surface.
(Crystal Layer)
    Material: GaN
    Growth method: HVPE method
    Growth temperature: 1,050° C.
    V/III ratio: 2
    (That is, the crystal layer was grown through step-flow growth with the c-plane serving as the growth surface.)
    Thickness from the main surface of the base substrate to the surface of the crystal layer: 2 mm
(Slicing Condition and Polishing Condition)
    The same as in the example.
(1-2) Evaluation
Observation of Laminated Structure Before the substrates of the example were sliced, a cross section of the laminated structure was observed using a fluorescence microscope. The surface of the laminated structure was also observed using an optical microscope.

Observation of Nitride Semiconductor Substrate Using Multiphoton Excitation Microscope Main surfaces of the base substrate, the substrate of the comparative example, and the substrates of the example were observed using a multiphoton excitation microscope. At this time, the dislocation density was measured by measuring a dark spot density over the entire main surface for every 250 μm field of view. It was confirmed that all dark spots on these substrates were penetrating dislocations by performing the measurement while shifting a focus in the thickness direction. Further, at this time, the ratio of the number of regions (low dislocation density regions) having a dislocation density lower than $1 \times 10^6$ cm$^{-2}$ to the total number of measurement regions of 250 μm field of view was determined. As shown in the results described below, the "low dislocation density regions" referred to herein means regions having a dislocation density lower than an average dislocation density in the main surface of the crystal layer of the comparative example in which the crystal layer was grown without the three-dimensional growth step being performed.

X-Ray Rocking Curve Measurement

X-ray rocking curve measurement of the (0002) plane was performed for each of the base substrate, the substrate of the comparative example, and the substrates of the example. At this time, in the main surface of each of the substrates, the measurement was performed at a plurality of measurement points that were set at 5 mm intervals on a straight line that passed through the center of the main surface and extended along the m-axis direction and a straight line that passed through the center of the main surface and extended along the a-axis direction. As a result of the measurement, a peak angle & formed between the main surface and X rays incident on the main surface was plotted for positions on the straight lines, and was approximated by a linear function of the positions. The radius of curvature of a c-plane was determined based on the reciprocal of the slope of the linear function. In the above-described arrangement in the device used in this experiment, the slope of the linear function being negative indicates that the c-plane was convex.

(1-3) Result

Results are shown in Table 1.

TABLE 1

|  | Example | Comparative example | Base substrate |
|---|---|---|---|
| Average dislocation density (cm$^{-2}$) | $1.2 \times 10^5$ | $1.5 \times 10^6$ | $3.0 \times 10^6$ |
| Percentage (%) of low dislocation density regions | 93 | 30 | 0 |
| Radius (m) of curvature of c-plane | 38.4 to 1129 | 11.3 | 7.64 |

Result of Observation of Laminated Structure

Figure 9A:
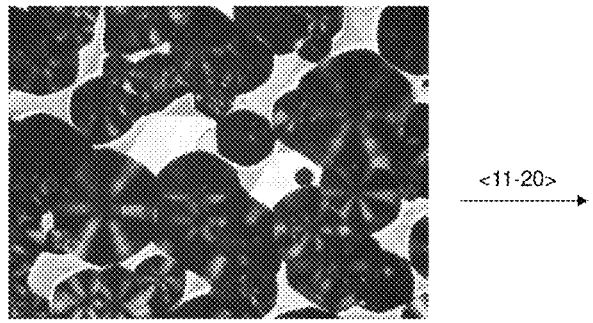
FIG. 9(a) is a diagram showing an observation image of a surface of a laminated structure of Experiment 1, which was observed using an optical microscope.
Figure 9B:
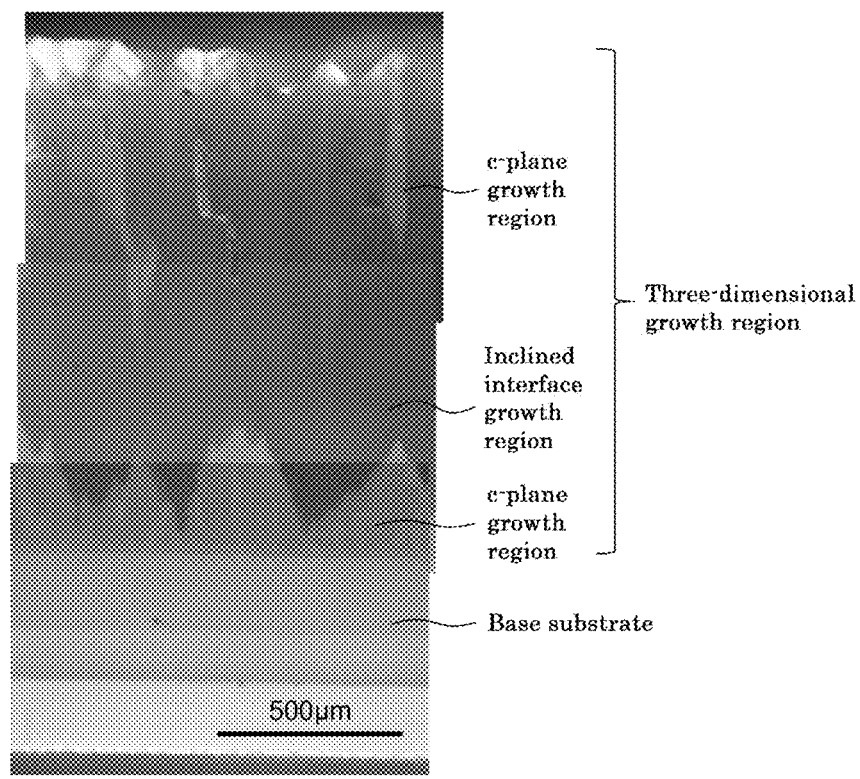
FIG. 9(b) is a diagram showing an observation image of a cross section of the laminated structure of Experiment 1, which was observed using a fluorescence microscope.

FIG. 9(a) is a diagram showing an observation image of the surface of the laminated structure of Experiment 1, which was observed using an optical microscope, and FIG. 9(b) is a diagram showing an observation image of a cross section of the laminated structure of Experiment 1, which was observed using a fluorescence microscope. The cross section shown in FIG. 9(b) was taken along a <11-20> axis.

As shown in FIG. 9(b), in the laminated structure of the example, the three-dimensional growth layer included a c-plane growth region that grew with the c-plane serving as the growth surface and an inclined interface growth region that grew with inclined interfaces serving as growth surfaces, based on a difference in growth surfaces during the growth process (i.e., difference in oxygen concentration).

The c-plane growth region included a portion corresponding to an initial layer that grew on the base substrate in an initial stage of the growth with the c-plane serving as a growth surface. The initial layer was formed with a predetermined thickness over the entire main surface of the base substrate.

The c-plane disappeared at least once, and therefore, the c-plane growth region was not continuous from the base substrate to the surface (uppermost surface) of the three-dimensional growth layer.

At least a portion of the inclined interface growth region was provided continuously along the main surface of the base substrate. That is, it was confirmed that when a plurality of cross sections of the three-dimensional growth layer taken along the main surface of the base substrate were observed, there was a cross section that did not include the c-plane growth region, which grew with the c-plane serving as the growth surface, in at least a portion in the thickness direction of the three-dimensional growth layer.

The c-plane growth region included a plurality of valleys and a plurality of mountains. An average value of angles formed between pairs of inclined portions in the c-plane growth region was about 52°. An average distance between closest peaks was about 234 µm.

As shown in FIG. 9(b), a second c-plane growth region was also present at positions that overlapped with the inclined interface growth region in the cross-sectional view. The second c-plane growth region was generated and disappeared during the growth process of the three-dimensional growth layer, and accordingly, the width of the second c-plane growth region in the cross-sectional view (i.e., the size of the second c-plane growth region in a plan view) randomly varied in the direction from the base substrate toward the surface of the three-dimensional growth layer.

As shown in FIG. 9(a), a plurality of recessed portions formed by inclined interfaces other than the c-plane were generated in the surface of the three-dimensional growth layer. Six bright surfaces were formed in each recessed portion generated in the surface of the three-dimensional growth layer. That is, the recessed portions had six inclined interfaces.

Based on the direction of the orientation flat of the base substrate, ridges in the recessed portions extended along the direction of a <1-100> axis, and inclined interfaces forming the recessed portions were planes of which the direction of the normal was inclined with respect to the <11-20> axis (i.e., {11-2m} planes).

In the cross section shown in FIG. 9(b) taken along a direction extending along the <11-20> axis, an angle formed by the inclined interfaces in the three-dimensional growth layer with respect to the main surface of the base substrate was about 47° or less.

Here, angles of {11-2m} planes with respect to a 100011 plane of GaN are as follows.

{11-21} plane: 72.9°
{11-22} plane: 58.4°
{11-23} plane: 47.3°
{11-24} plane: 39.1°

Based on the above, it was confirmed that the inclined interfaces generated in the surface of the three-dimensional growth layer were {11-2m} planes satisfying m≥3. Also, it was confirmed that many of the inclined interfaces were {11-23} planes.

Figure 10:
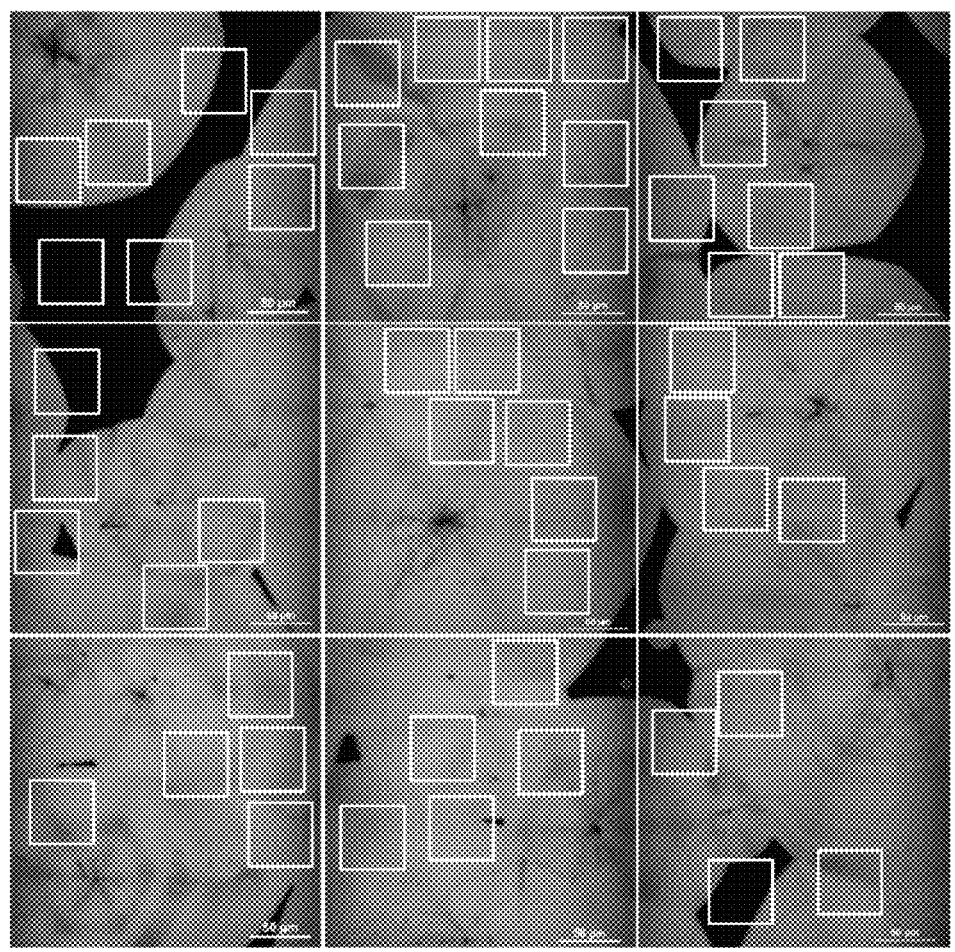
FIG. 10 is a schematic diagram showing an observation image of a main surface of a nitride semiconductor substrate A obtained in Experiment 1, which was observed using a multiphoton excitation microscope.

Result of Observation of Nitride Semiconductor Substrate Using Multiphoton Excitation Microscope FIG. 10 is a schematic diagram showing an observation image of the main surface of the nitride semiconductor substrate A obtained in Experiment 1, which was observed using a multiphoton excitation microscope. Note that square portions surrounded by bold lines indicate dislocation-free regions that are 50µ square.

As shown in FIG. 10, the nitride semiconductor substrate of the example included an inclined interface growth region that was observed to be relatively bright. The ratio of the area occupied by the inclined interface growth region in the main surface of the nitride semiconductor substrate of the example was 80% or more.

As shown in Table 1, in the nitride semiconductor substrate of the example, the average dislocation density in the main surface was significantly lowered as compared with the base substrate and the nitride semiconductor substrate of the comparative example, and was less than $5.5 \times 10^5$ cm$^{-2}$. In a case where the crystal layer is grown to be thick as in the comparative example, the dislocation density of the nitride semiconductor substrate is lowered as compared with the base substrate, but the dislocation density of the nitride semiconductor substrate of the example was further lowered compared to the comparative example.

Also, the nitride semiconductor substrate of the example did not include a region having a dislocation density higher than $3 \times 10^6$ cm$^{-2}$. In the nitride semiconductor substrate of the example, regions (low dislocation density regions) having a dislocation density of less than $1 \times 10^6$ cm$^{-2}$ constituted 90% or more of the main surface.

Also, as shown in FIG. 10, the main surface of the nitride semiconductor substrate of the example included dislocation-free regions that were at least 50 µm square. Also, the main surface of the nitride semiconductor substrate of the example included dislocation-free regions that were 50 µm square and did not overlap each other, at a density of 100 regions/cm$^2$ or more. Specifically, the density of dislocation-free regions that were 50 µm square and did not overlap each other in the main surface of the nitride semiconductor substrate of the example was about 5000 regions/cm$^2$.

Also, when a c-plane growth region, which was observed to be dark, was checked in an enlarged view, the c-plane growth region included a dislocation-free region that was at least 50 μm square.

Furthermore, when the main surface of the nitride semiconductor substrate of the example was observed using a multiphoton excitation microscope in a field of view that was 50 μm square and included a dislocation concentrated region dca, the dislocation density determined based on a dark spot density was less than $3 \times 10^6$ cm$^{-2}$.

Note that as shown in FIG. 10, the substrate of the example included basal plane dislocations. When a CL image of the substrate of the example was observed and an imaginary line segment having a length of 200 μm was arbitrarily drawn in the CL image of the main surface, the number of intersections between the line segment and basal plane dislocations was no greater than 10.

Radius of Curvature of c-Plane

Next, the radius of curvature of the c-plane will be described using Table 1 and FIGS. 11(a) to 12(c).

Figure 11A:
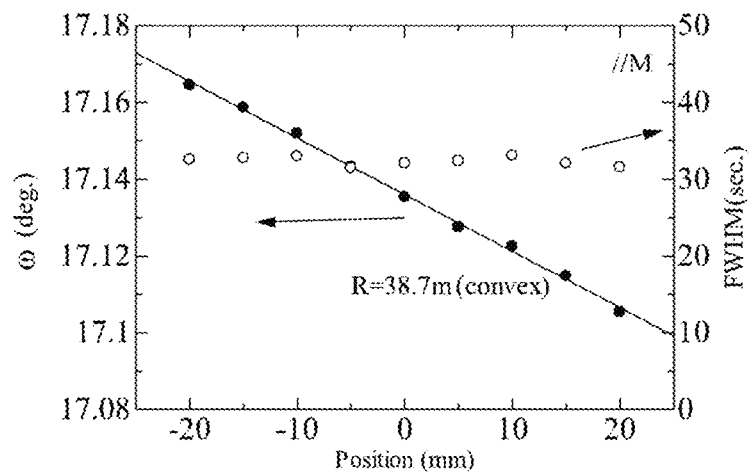
FIG. 11(a) is a diagram showing a result of X-ray diffraction rocking curve measurement performed with respect to a direction extending along the m-axis of the nitride semiconductor substrate A obtained in Experiment 1.
Figure 11B:
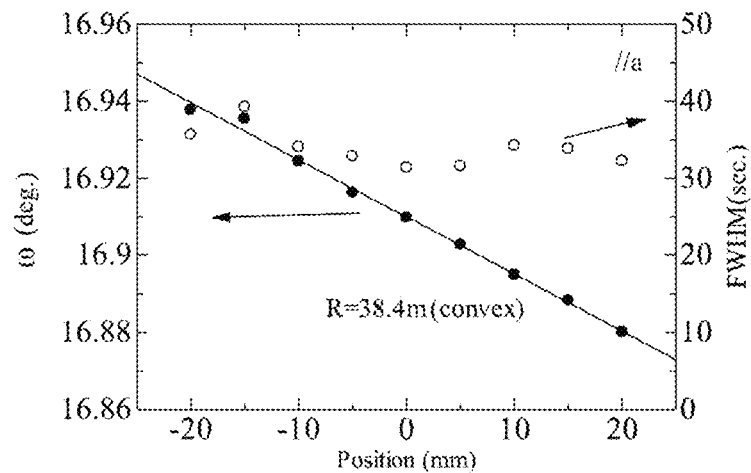
FIG. 11(b) is a diagram showing a result of X-ray diffraction rocking curve measurement performed with respect to a direction extending along the a-axis of the nitride semiconductor substrate A obtained in Experiment 1.
Figure 12A:
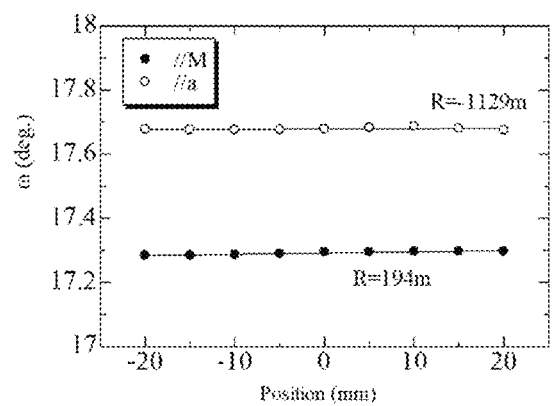
FIG. 12(a) is a diagram showing a result of X-ray diffraction rocking curve measurement performed with respect to predetermined directions of a nitride semiconductor substrate B obtained in Experiment 1.
Figure 12B:
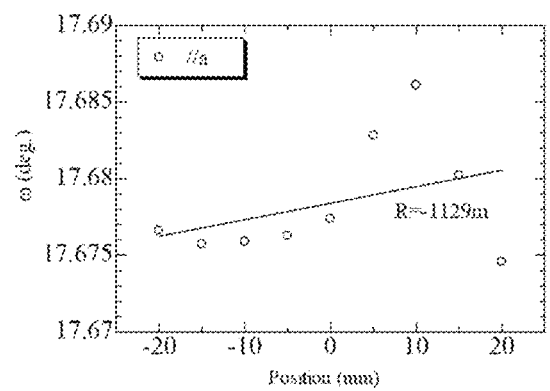
FIG. 12(b) is an enlarged view of the result of X-ray diffraction rocking curve measurement performed with respect to a direction extending along the a-axis shown in FIG. 12(a)
Figure 12C:
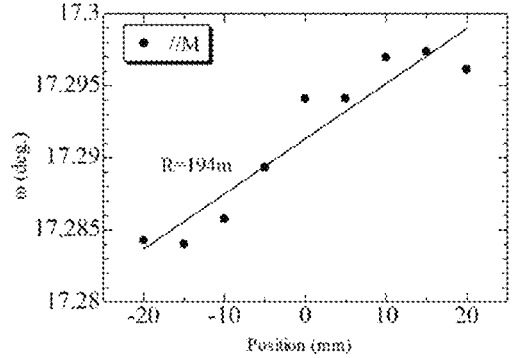
FIG. 12(c) is an enlarged view of the result of X-ray diffraction rocking curve measurement performed with respect to a direction extending along the m-axis shown in FIG. 12(a).

FIG. 11(a) is a diagram showing a result of X-ray diffraction rocking curve measurement performed with respect to a direction extending along the m-axis of the nitride semiconductor substrate A obtained in Experiment 1, and FIG. 11(b) is a diagram showing a result of X-ray diffraction rocking curve measurement performed with respect to a direction extending along the a-axis of the nitride semiconductor substrate A obtained in Experiment 1. FIG. 12(a) is a diagram showing a result of X-ray diffraction rocking curve measurement performed with respect to predetermined directions of the nitride semiconductor substrate B obtained in Experiment 1, FIG. 12(b) is an enlarged view of the result of X-ray diffraction rocking curve measurement performed with respect to a direction extending along the a-axis shown in FIG. 12(a), and FIG. 12(c) is an enlarged view of the result of X-ray diffraction rocking curve measurement performed with respect to a direction extending along the m-axis shown in FIG. 12(a). Note that R in the diagrams represents the radius of curvature of a c-plane, and R being negative indicates that the c-plane was convex with respect to the main surface as described above.

In Table 1 shown above, c-planes in the base substrate and the substrate of the comparative example were curved in concave spherical shapes.

As shown in Table 1 and FIGS. 11(a) to 12(c), the radius of curvature (absolute value thereof) of the c-plane in the substrate of the example was larger than the radiuses of curvature of the c-planes in the base substrate and the substrate of the comparative example, and was 30 m or more. In a case where the crystal layer is grown to be thick as in the comparative example, the radius of curvature of the c-plane in the substrate becomes larger than the radius of curvature of the c-plane in the base substrate, but the radius of curvature of the c-plane in the substrate of the example was larger than the radiuses of curvature of the c-plane in the nitride semiconductor substrate of the comparative example.

Also, as shown in FIGS. 12(a) to 12(c), in the substrate B sliced from the laminated structure of the example at a position close to the base substrate, the c-plane was slightly concave with respect to the main surface, but the radius of curvature of the c-plane was large, and the c-plane was almost flat. According to the measurement results enlarged in FIGS. 12(b) and 12(c), the c-plane of the substrate B included a portion that was curved in a concave spherical shape with respect to the main surface and a portion that was curved in a convex spherical shape with respect to the main surface.

On the other hand, as shown in FIGS. 11(a) and 11(b), in the substrate A sliced from the laminated structure of the example at a position close to the surface, the c-plane was curved in a convex spherical shape with respect to the main surface. Also, absolute values of the radiuses of curvature of the c-plane in the substrate A were smaller than absolute values of the radiuses of curvature of the c-plane in the substrate B.

In the substrates A and B of the example, when the peak angle ω was approximated by a linear function of positions in the X-ray rocking curve measurement of the c-plane, an error with respect to the linear function was small. Specifically, an error of a measured peak angle ω with respect to the linear function approximated as described above was no greater than 0.01°.

Summary of Experiment 1

In the example described above, the first growth condition was adjusted so as to satisfy the formula (1) in the three-dimensional growth step. This made sure that the c-plane disappeared at least once during the growth process of the three-dimensional growth layer. By making the c-plane disappear at least once, it was possible to reliably bend dislocations at positions at which inclined interfaces in the three-dimensional growth layer were exposed. It was confirmed that, as a result, the dislocation density in the main surface of the nitride semiconductor substrate was lowered.

Also, in the example, the base substrate described above was used and the first growth condition was adjusted so as to satisfy the formula (1), and therefore, {11-2m} planes satisfying m≥3 were generated as inclined interfaces. This made it possible to make the average distance between closest peaks in the three-dimensional growth layer more than 100 μm. It was confirmed that, as a result, the dislocation density in the main surface of the nitride semiconductor substrate was sufficiently lowered. Also, it was confirmed that dislocation-free regions that were at least 50 μm square were formed as a result of the average distance between closest peaks being more than 100 μm.

Also, in the example, the expanded inclined interface layer grew three-dimensionally after growing two-dimensionally to a predetermined thickness with the c-plane serving as the growth surface in an initial stage of the three-dimensional growth step. Therefore, the crystal axis was made uniform over the entire main surface of the base substrate, and generation of new dislocations due to misalignment between crystal axes was suppressed. It was confirmed that, as a result, the dislocation density was lowered.

Also, it was confirmed that, in the example, the radius of curvature of the c-plane in the nitride semiconductor substrate was larger than the radius of curvature of the c-plane in the base substrate due to the stress offset effect of the inclined interface growth region, and a variation in the off-angle of the c-axis in the nitride semiconductor substrate was smaller than a variation in the off-angle of the c-axis in the base substrate.

It was confirmed that, in the example, the c-plane varied from concave to convex from the base substrate side toward the surface side of the laminated structure due to the stress offset effect of the inclined interface growth region. Therefore, it is thought that a nitride semiconductor substrate of which the c-plane is extremely flat can be obtained by optimizing the position in the thickness direction at which the nitride semiconductor substrate is sliced from the laminated structure.

Figure 15:
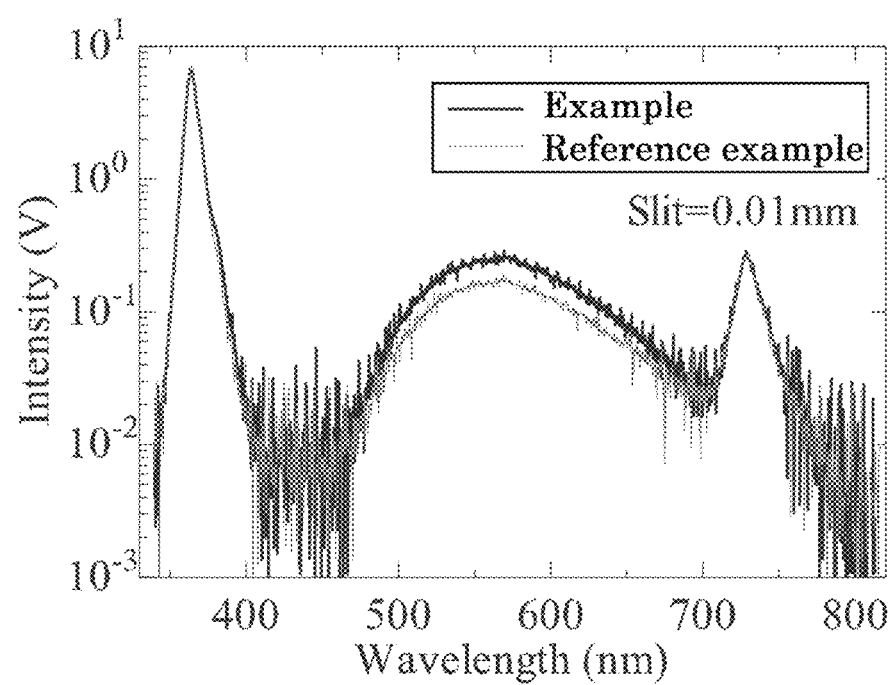
FIG. 15 shows photoluminescence spectrums of the semiconductor layer of the laminate of the example and the semiconductor layer of the reference laminate of the reference example in Experiment 2.

(2) Experiment 2
(2-1) Manufacture of Laminate
The following laminates were prepared using the base substrate and the substrate A of the example.
[Conditions for Preparing Laminate of Example]
(Substrate)
 Substrate A of example
(Semiconductor Layer)
 Material: GaN
 Growth method: MOVPE method
 Growth condition: conditions for step-flow growth of non-doped GaN in which c-plane serves as growth surface
 Thickness of semiconductor layer: 2 μm
[Conditions for Preparing Reference Laminate of Reference Example]
(Substrate)
 Base substrate used in Experiment 1 (i.e., substrate that did not include inclined interface growth region)
(Semiconductor Layer)
 The same as the conditions of the semiconductor layer in the laminate of the example.
(2-2) Evaluation
Observation of Laminate
 CL images of the surface of the semiconductor layer of the laminate of the example and the surface of the semiconductor layer of the reference laminate of the reference example were observed using an SEM.
Photoluminescence Measurement
 Photoluminescence (PL) mapping measurement was performed on the semiconductor layer of the laminate of the example and the semiconductor layer of the reference laminate of the reference example using LabRAM HR Evolution manufactured by HORIBA, Ltd. At this time, a He-Cd laser of which the wavelength was 325 nm and power was 1.25 mW was used as an excitation light source. The diameter of the spot size of the laser was 5 μm. That is, irradiation intensity was $6.4\times10^3$ $Wcm^{-2}$. Measurement intervals were 500 μm. The PL mapping measurement was performed at a temperature of 27° C. with a temperature difference less than 1° C. on the semiconductor layer of the laminate of the example and the semiconductor layer of the reference laminate of the reference example.
(2-3) Result
Result of Observation of Laminate
 FIG. 13(a) is a diagram showing a cathodoluminescence image of the surface of the semiconductor layer of the laminate of the example in Experiment 2, which was observed using a scanning electron microscope, and FIG. 13(b) is a diagram showing a cathodoluminescence image of the surface of the semiconductor layer of the reference laminate of the reference example in Experiment 2, which was observed using the scanning electron microscope.
 As shown in FIG. 13(b), many dislocations inheriting dislocations in the base substrate were observed in the semiconductor layer of the reference example. Also, microscopic unevenness of light emission corresponding to surface morphology of the semiconductor layer was observed in the semiconductor layer of the comparative example.
 In contrast, as shown in FIG. 13(a), in the semiconductor layer of the example, only dislocations in dislocation concentrated regions in the substrate were inherited, and there were few dislocations in regions other than the dislocation concentrated regions. Also, the semiconductor layer of the example included dislocation-free regions that were at least 50 μm square. Also, unevenness of light emission was not observed in the semiconductor layer of the example, and it was confirmed that the surface of the semiconductor layer of the example was flat.
PL Measurement Result
 FIG. 14(a) is a diagram showing a result of photoluminescence mapping measurement performed on the laminate of the example in Experiment 2, and FIG. 14(b) is a diagram showing a result of photoluminescence mapping measurement performed on the reference laminate of the reference example in Experiment 2.
 As shown in FIG. 14(a), in the result of PL mapping measurement performed on the entire surface of the laminate of the example, macroscopic unevenness of light emission was not observed as in the result of the comparative example shown in FIG. 14(b).
 FIG. 15 shows photoluminescence spectrums of the semiconductor layer of the laminate of the example and the semiconductor layer of the reference laminate of the reference example in Experiment 2.
 As shown in FIG. 15, a difference between the maximum peak wavelength in the semiconductor layer of the laminate of the example and the maximum peak wavelength in the semiconductor layer of the reference laminate of the reference example was no greater than 1 nm. That is, a peak shift did not occur in Band edge emission of the semiconductor layer of the example.
Summary
 In the example described above, the surface of the semiconductor layer in the laminate of the example was flat, and a peak shift did not occur in Band edge emission of the semiconductor layer. Based on these results, it was confirmed that crystal strain due to the substrate of the example did not occur in the semiconductor layer gown on the substrate. That is, it was proved that the substrate of the example was sufficient to be practically used as a substrate for manufacturing a light emitting element or the like.
<Preferable Aspects of the Present Disclosure>
 Hereinafter, preferable aspects of the present disclosure will be supplementarily described.
Supplementary Note 1
 A nitride semiconductor substrate that is constituted by a single crystal of a group III nitride semiconductor and includes a main surface for which the closest low index crystal plane is a (0001) plane, the nitride semiconductor substrate including:
 an inclined interface growth region that has grown with inclined interfaces other than the (0001) plane serving as growth surfaces,
 wherein a ratio of an area occupied by the inclined interface growth region in the main surface is 80% or more,
 when a dislocation density is determined based on a dark spot density by observing the main surface in a field of view that is 250 μm square using a multiphoton excitation microscope, the main surface does not include a region that has a dislocation density higher than $3\times10^6$ $cm^{-2}$, and
 the main surface includes dislocation-free regions that are 50 μm square and do not overlap each other, at a density of 100 regions/$cm^2$ or more.
Supplementary Note 2
 The nitride semiconductor substrate according to Supplementary Note 1, wherein
 when X-ray rocking curve measurement of a (0002) plane is performed at positions on a straight line that passes through the center in the main surface, and a peak angle ω formed between the main surface and X rays incident on the main surface is plotted for the positions on the straight line and approximated by a linear function of the positions, a radius of curvature of the (0001) plane determined based on the reciprocal of a slope of the linear function is 15 m or more, and an error of the measured peak angle ω with respect to the linear function is no greater than 0.05°.

Supplementary Note 3

The nitride semiconductor substrate according to Supplementary Note 1 or 2, wherein the nitride semiconductor substrate does not include a c-plane growth region that has grown with the (0001) plane serving as a growth surface.

Supplementary Note 4

The nitride semiconductor substrate according to Supplementary Note 1 or 2, wherein the nitride semiconductor substrate includes a c-plane growth region that has grown with the (0001) plane serving as a growth surface, and the c-plane growth region in the main surface includes a dislocation-free region that is at least 50 μm square.

Supplementary Note 5

The nitride semiconductor substrate according to any one of Supplementary Notes 1 to 4, wherein the nitride semiconductor substrate includes a dislocation concentrated region in which dislocations are relatively concentrated, and when a dislocation density is determined based on a dark spot density by observing the main surface in a field of view that is 50 μm square and includes the dislocation concentrated region using a multiphoton excitation microscope, the dislocation density is less than $3 \times 10^6$ $cm^{-2}$.

Supplementary Note 6

The nitride semiconductor substrate according to any one of Supplementary Notes 1 to 5, wherein when an imaginary line segment having a length of 200 μm is arbitrarily drawn in a cathodoluminescence image of the main surface, the number of intersections between the line segment and basal plane dislocations is no greater than 10.

Supplementary Note 7

The nitride semiconductor substrate according to any one of Supplementary Notes 1 to 6, wherein when a laminate is prepared by epitaxially growing a semiconductor layer that is constituted by a non-doped single crystal of a predetermined group III nitride semiconductor on the main surface, a reference laminate is prepared by epitaxially growing the semiconductor layer on a substrate constituted by a single crystal of a group III nitride semiconductor that is the same as the nitride semiconductor substrate in all aspects other than not including the inclined interface growth region, and photoluminescence of the semiconductor layers in the laminate and the reference laminate is measured with a temperature difference of less than 1° C., a difference between the maximum peak wavelength in the semiconductor layer of the laminate and the maximum peak wavelength in the semiconductor layer of the reference laminate is no greater than 1 nm.

Supplementary Note 8

A laminated structure comprising:

a base substrate that is constituted by a single crystal of a group III nitride semiconductor, has a mirror-finished main surface, and in which a low index crystal plane closest to the main surface is a (0001) plane;

a low oxygen concentration region that is provided directly on the main surface of the base substrate and is constituted by a single crystal of a group III nitride semiconductor; and a high oxygen concentration region that is provided on the low oxygen concentration region and is constituted by a single crystal of a group III nitride semiconductor, wherein an oxygen concentration in the high oxygen concentration region is higher than an oxygen concentration in the low oxygen concentration region, and when any cross section that is perpendicular to the main surface is observed, an upper surface of the low oxygen concentration region includes a plurality of valleys and a plurality of mountains, and an average distance between a pair of mountains spaced apart from each other in a direction extending along the main surface is more than 100 μm, the pair of mountains being closest to each other among the plurality of mountains with one of the plurality of valleys sandwiched between them.

Supplementary Note 9

The laminated structure according to Supplementary Note 8, wherein the low oxygen concentration region is not continuous from the base substrate to a surface of the high oxygen concentration region.

Supplementary Note 10

The laminated structure according to Supplementary Note 8 or 9, wherein when a plurality of cross sections of the high oxygen concentration region taken along the main surface are observed, there is a cross section that does not include the low oxygen concentration region, in at least a portion in a thickness direction of the high oxygen concentration region.

Supplementary Note 11

A method for manufacturing a nitride semiconductor substrate using a vapor phase growth method, comprising:

a step of preparing a base substrate that is constituted by a single crystal of a group III nitride semiconductor, has a mirror-finished main surface, and in which a low index crystal plane closest to the main surface is a (0001) plane;

a step of growing a three-dimensional growth layer by epitaxially growing a single crystal of a group III nitride semiconductor that has a top surface at which a (0001) plane is exposed, directly on the main surface of the base substrate, generating a plurality of recessed portions formed by inclined interfaces other than the (0001) plane in the top surface, and gradually expanding the inclined interfaces toward an upper side of the main surface of the base substrate to make the (0001) plane disappear from the top surface at least once; and a step of forming a nitride semiconductor substrate by slicing the three-dimensional growth layer, wherein in the step of forming the three-dimensional growth layer, a plurality of valleys and a plurality of peaks are formed in a surface of the three-dimensional growth layer by generating the plurality of recessed portions in the top surface of the single crystal and making the (0001) plane disappear, and when any cross section that is perpendicular to the main surface is observed, an average distance between a pair of peaks spaced apart from each other in a direction extending along the main surface is more than 100 μm, the pair of peaks being closest to each other among the plurality of peaks with one of the plurality of valleys sandwiched between them.

Supplementary Note 12

The method for manufacturing a nitride semiconductor substrate according to Supplementary Note 11, wherein
in the step of growing the three-dimensional growth layer, an inclined interface growth region grown with the inclined interfaces serving as growth surfaces is formed in the three-dimensional growth layer, and
a ratio of an area occupied by the inclined interface growth region in a cross section of the three-dimensional growth layer taken along the main surface is 80% or more.

Supplementary Note 13

The method for manufacturing a nitride semiconductor substrate according to Supplementary Note 12, wherein
the step of forming the three-dimensional growth layer includes a step of forming an inclined interface maintaining layer in which growth of the single crystal is continued over a predetermined thickness while a state in which the inclined interface growth region occupies 80% or more of the area of the cross section taken along the main surface is maintained, after the (0001) plane has disappeared from the top surface.

Supplementary Note 14

The method for manufacturing a nitride semiconductor substrate according to Supplementary Note 13, wherein
in the step of slicing the three-dimensional growth layer, the inclined interface maintaining layer is sliced.

Supplementary Note 15

The method for manufacturing a nitride semiconductor substrate according to Supplementary Note 14, wherein
in the step of slicing the three-dimensional growth layer, the inclined interface maintaining layer is sliced at a position spaced upward from a position at which the (0001) plane disappeared from the top surface.

Supplementary Note 16

The method for manufacturing a nitride semiconductor substrate according to any one of Supplementary Notes 11 to 15, wherein
in the step of forming the three-dimensional growth layer, the plurality of recessed portions are generated in the top surface of the single crystal after the single crystal is grown so as to have a predetermined thickness with the (0001) plane serving as a growth surface.

Supplementary Note 17

The method for manufacturing a nitride semiconductor substrate according to any one of Supplementary Notes 11 to 16, wherein
in the step of forming the three-dimensional growth layer, {11–2m} planes satisfying m≥3 are generated as the inclined interfaces.

Supplementary Note 18

The method for manufacturing a nitride semiconductor substrate according to any one of Supplementary Notes 11 to 17, wherein
in the step of forming the three-dimensional growth layer, the average distance between the pair of peaks closest to each other is less than 80 μm.

Supplementary Note 19

The method for manufacturing a nitride semiconductor substrate according to any one of Supplementary Notes 11 to 18, wherein
in the step of preparing the base substrate, the base substrate of which the (0001) plane is curved in a concave spherical shape with respect to the main surface is prepared, and
in the step of slicing the three-dimensional growth layer, a radius of curvature of the (0001) plane of the nitride semiconductor substrate is larger than a radius of curvature of the (0001) plane of the base substrate.

REFERENCE SIGNS LIST

10 Base substrate
30 Three-dimensional growth layer
50 Nitride semiconductor substrate (substrate)

The invention claimed is:

1. A nitride semiconductor substrate that is constituted by a single crystal of a group III nitride semiconductor and includes a main surface for which the closest low index crystal plane is a (0001) plane, the nitride semiconductor substrate comprising
an inclined interface growth region that has grown with inclined interfaces other than the (0001) plane serving as growth surfaces,
wherein a ratio of an area occupied by the inclined interface growth region in the main surface is 80% or more,
when a dislocation density is determined based on a dark spot density by observing the main surface in a field of view that is 250 μm square using a multiphoton excitation microscope, the main surface does not include a region that has a dislocation density higher than $3 \times 10^6$ cm$^{-2}$,
wherein regions having a dislocation density lower than $1 \times 10^6$ cm$^{-2}$ constitute 80% or more of the main surface, and
the main surface includes dislocation-free regions that are 50 μm square and do not overlap each other, at a density of 100 regions/cm$^2$ or more.

2. The nitride semiconductor substrate according to claim 1, wherein
when X-ray rocking curve measurement of a (0002) plane is performed at positions on a straight line that passes through the center in the main surface, and a peak angle @ formed between the main surface and X rays incident on the main surface is plotted for the positions on the straight line and approximated by a linear function of the positions,
a radius of curvature of the (0001) plane determined based on the reciprocal of a slope of the linear function is 15 m or more, and
an error of the measured peak angle ω with respect to the linear function is no greater than 0.05°.

3. The nitride semiconductor substrate according to claim 1, wherein
the nitride semiconductor substrate does not include a c-plane growth region that has grown with the (0001) plane serving as a growth surface.

4. The nitride semiconductor substrate according to claim 1, wherein
the nitride semiconductor substrate includes a c-plane growth region that has grown with the (0001) plane serving as a growth surface, and
the c-plane growth region in the main surface includes a dislocation-free region that is at least 50 μm square.

5. The nitride semiconductor substrate according to claim 1, wherein
the nitride semiconductor substrate includes:
a low dislocation density region; and
a dislocation concentrated region in which dislocations are more concentrated than in the low dislocation density region, and
when a dislocation density is determined based on a dark spot density by observing the main surface in a field of view that is 50 μm square and includes the dislocation concentrated region using a multiphoton excitation microscope, the dislocation density is less than $3 \times 10^6$ cm$^{-2}$.

6. The nitride semiconductor substrate according to claim 1, wherein
when an imaginary line segment having a length of 200 μm is arbitrarily drawn in a cathodoluminescence image of the main surface, the number of intersections between the line segment and basal plane dislocations is no greater than 10.

7. The nitride semiconductor substrate according to claim 1, wherein
when a laminate is prepared by epitaxially growing a semiconductor layer that is constituted by a non-doped single crystal of a predetermined group III nitride semiconductor on the main surface, a reference laminate is prepared by epitaxially growing the semiconductor layer on a substrate constituted by a single crystal of a group III nitride semiconductor that is the same as the nitride semiconductor substrate in all aspects other than not including the inclined interface growth region, and photoluminescence of the semiconductor layers in the laminate and the reference laminate is measured with a temperature difference of less than 1° C.,
a difference between the maximum peak wavelength in the semiconductor layer of the laminate and the maximum peak wavelength in the semiconductor layer of the reference laminate is no greater than 1 nm.

* * * * *